United States Patent
Yotsuhashi et al.

(10) Patent No.: US 7,312,392 B2
(45) Date of Patent: Dec. 25, 2007

(54) THERMOELECTRIC CONVERSION DEVICE, AND COOLING METHOD AND POWER GENERATING METHOD USING THE DEVICE

(75) Inventors: Satoshi Yotsuhashi, Hyogo (JP); Tsutomu Kanno, Osaka (JP); Hideaki Adachi, Osaka (JP); Akihiro Odagawa, Osaka (JP); Yasunari Sugita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 373 days.

(21) Appl. No.: 11/194,685

(22) Filed: Aug. 2, 2005

(65) Prior Publication Data
US 2006/0021646 A1    Feb. 2, 2006

Related U.S. Application Data

(63) Continuation of application No. PCT/JP2004/019532, filed on Dec. 27, 2004.

(30) Foreign Application Priority Data
Mar. 1, 2004 (JP) ............................. 2004-055952
Jun. 2, 2004 (JP) ............................. 2004-164200

(51) Int. Cl.
*H01L 35/22* (2006.01)
(52) U.S. Cl. .................. 136/236.1; 136/203; 136/205; 136/238; 136/239; 136/240; 136/241
(58) Field of Classification Search ................. 136/203, 136/205, 236.1, 238, 239, 240, 241
See application file for complete search history.

(56) References Cited

U.S. PATENT DOCUMENTS
6,833,083 B2    12/2004  Imai et al.
6,914,343 B2 *   7/2005  Hiller et al. .................. 290/43
2004/0115464 A1  6/2004  Adachi et al.

FOREIGN PATENT DOCUMENTS
JP              9-321346        12/1997
JP              11-330569       11/1999

(Continued)

*Primary Examiner*—Nam Nguyen
*Assistant Examiner*—Anthony Fick
(74) *Attorney, Agent, or Firm*—McDermott Will & Emery LLP

(57) ABSTRACT

The present invention provides a thermoelectric conversion device having high thermoelectric conversion performance. In this device, electrodes are arranged so that electric current flows in an interlayer direction of a layered substance, unlike the arrangements derived from common knowledge in the art. In the thermoelectric conversion device according to the present invention, a thermoelectric-conversion film is obtained through epitaxial growth and formed by arranging an electrically conducting layer and an electrically insulating layer alternately; the electrically conducting layer has an octahedral crystal structure in which a transition metal atom M is positioned at its center and oxygen atoms are positioned at its vertexes; and the electrically insulating layer includes a metal element or a crystalline metal oxide. The c axis of the layered substance made of the electrically conducting layer and the electrically insulating layer is parallel to an in-plane direction of the substrate, and a pair of electrodes are arranged so that electric current flows along the c axis.

24 Claims, 20 Drawing Sheets

FOREIGN PATENT DOCUMENTS

| | | |
|---|---|---|
| JP | 2000-269560 | 9/2000 |
| JP | 2001-284622 | 10/2001 |
| JP | 2001-284662 | 10/2001 |
| JP | 2002-026407 | 1/2002 |
| JP | 2002-111077 | 4/2002 |
| JP | 2002-141562 | 5/2002 |
| JP | 2002-270907 | 9/2002 |
| JP | 2002-316898 | 10/2002 |
| JP | 2002-321922 | 11/2002 |
| JP | 2002-368292 | 12/2002 |
| JP | 2003-034583 | 2/2003 |
| JP | 2003-095741 | 4/2003 |
| JP | 2003-133600 | 5/2003 |
| JP | 2003-179272 | 6/2003 |
| JP | 2003-218411 | 7/2003 |
| JP | 2003-282968 | 10/2003 |
| WO | WO 03/085748 A1 | 10/2003 |

\* cited by examiner

Pure BiCo

20% Pb doped

THERMOELECTRIC CONVERSION DEVICE, AND COOLING METHOD AND POWER GENERATING METHOD USING THE DEVICE

REFERENCE TO RELATED APPLICATION

This Application is a continuation of International Application No. PCT/JP2004/019532, whose international filing date is Dec. 27, 2004, which in turn claims the benefit of Japanese Application No. 2004-055952, filed Mar. 1, 2004 and Japanese Application No. 2004-164200, filed Jun. 2, 2004, the disclosures of which Applications are incorporated by reference herein. The benefit of the filing and priority dates of the International and Japanese Applications is respectfully requested.

BACKGROUND OF THE INVENTION

1. Field of the Invention

The present invention relates to a thermoelectric conversion device for conducting conversion between thermal energy and electric energy by the Peltier effect or the Seebeck effect.

2. Description of the Related Art

Thermoelectric power generation is a technology for directly converting thermal energy into electric energy with the use of the Seebeck effect, a phenomenon in which a temperature difference given to opposing ends of a substance causes a thermal electromotive force in proportion to the temperature difference, whereby electric power can be taken out by connecting a load externally and forming a closed circuit. This technology has been in practical use as power supplies for remote areas, power supplies for aerospace use, power supplies for military use, and so forth.

Thermoelectric cooling is a technology that utilizes the Peltier effect, a phenomenon in which heat is transferred by electrons carried by electric current. Specifically, when two substances having carriers with different signs, for example, a p-type semiconductor and an n-type semiconductor, are connected thermally in parallel and electrically in series, and a current is passed therethrough, heat absorption is caused at the junction of the two substances utilizing the difference in the directions of the heat flow, which reflects the difference in the signs of the carriers. This technology has been in practical use as local cooling devices such as for cooling electronic devices in a space station, wine coolers, and the like.

Generally, the performance of a thermoelectric conversion material is evaluated by a figure of merit Z, or a figure of merit ZT, which is made dimensionless by multiplying it by an absolute temperature T. The figure of merit ZT is an index represented as $ZT=S^2/\rho\kappa$ with S, $\rho$, and $\kappa$ of the substance, where S is Seebeck coefficient, $\rho$ is electric resistivity, and $\kappa$ is thermal conductivity. Conventional thermoelectric conversion materials have not reached to a practically usable level in terms of the evaluation based on the figure of merit ZT.

To date, many types of materials have been studied as thermoelectric conversion materials. For example, it has been reported that $Na_xCoO_2$, which is a layered oxide, shows good thermoelectric conversion performance (see JP 9-321346A and WO 03/085748). WO 03/085748 discloses, as a thermoelectric-conversion film, a $Na_xCoO_2$ film formed on the c plane of a sapphire substrate and having a c-axis orientation, i.e. having the c axis oriented perpendicularly to the substrate surface.

$Na_xCoO_2$ has a structure in which a $CoO_2$ layer, which is an electrically conducting layer, and Na layer, which is an electrically insulating layer, are arranged alternately. As is clear from the foregoing equation, a lower electric resistivity is desirable to increase the figure of merit ZT. For this reason, attempts have conventionally been made mainly to exploit the thermoelectric conversion performance of the electrically conducting layer regarding its in-plane directions, when a layered oxide as represented by $Na_xCoO_2$ is used as the thermoelectric conversion material.

With a layered oxide, the electric resistance in the in-plane directions is reduced by attaining a good crystal orientation. For example, JP 2000-269560A discloses a sintered compact having a uniform crystal orientation. JP 2003-95741A also discloses a polycrystal substance in which crystals are orientated.

There have been proposed methods of manufacturing a substance having a uniform crystal orientation, which include: a method of manufacturing a substance in which crystals are oriented, using a plate-shaped template (see JP 2002-321922A and JP 2002-26407A); a method in which a sintered compact is pulverized and shaped, and thereafter heat-melted and cooled to cause crystallization (JP 2002-111077A); a method in which a source material is dissolved in a solvent and the resultant gel is baked to grow a plate-shaped crystal (JP 2003-34583A); and so forth.

All of these techniques are for reducing the electric resistivity in in-plane directions by improving the crystal orientation of layered oxides, and as a result, improving the thermoelectric conversion performance.

Nevertheless, the figures of merit ZT achieved by the above-mentioned methods remain only slightly above ZT>1, which is the level regarded as a guideline for practically usable substances, with the use of limited substances and in certain temperature ranges, and the current state is that the figures of merit fall far short of the level of ZT>3, which is thought as the level required for wider proliferation of thermoelectric conversion devices.

The following gives a summary of publications in which conventional thermoelectric conversion devices are disclosed: JP 9-321346A, JP 2000-269560A, JP 2003-95741A, JP 2002-321922A, JP 2002-26407A, JP 2002-111077A, JP 2003-34583A, JP 2003-133600A, JP 2002-270907A, JP 11-330569A (Paragraph [0002]), WO 03/085748, JP 2002-316898A, and JP 2002-141562A.

SUMMARY OF THE INVENTION

With a layered substance, the thermoelectric conversion performance of the electrically conducting layer regarding its in-plane directions has not yet reached the level required for practical uses, even though its crystal orientation has improved.

The present inventors have made intensive studies on thermoelectric conversion characteristics of various layered substances not only in their in-plane directions of the electrically conducting layers but also in a direction in which the electrically conducting layers and the electrically insulating layers are arranged alternately (an interlayer direction or a layer-thickness thickness direction). Consequently, the inventors have found that depending on the size of the external field applied, a layered substance exhibits unexpectedly high thermoelectric conversion performance in an interlayer direction of the electrically conducting layers and the electrically insulating layers, and thus have reached the present invention.

The present invention provides a thermoelectric conversion device including a substrate, a thermoelectric-conversion film arranged on the substrate, and a pair of electrodes; wherein the thermoelectric-conversion film is a crystalline thin film obtained through epitaxial growth and formed by arranging an electrically conducting layer and an electrically insulating layer alternately; the electrically conducting layer has an octahedral crystal structure in which a transition metal atom M is positioned at the center and oxygen atoms are positioned at the vertexes; the electrically insulating layer includes a metal element or a crystalline metal oxide; the c axis of the crystalline thin film formed of the electrically conducting layer and the electrically insulating layer is parallel to an in-plane direction of the substrate; and the pair of electrodes are arranged so that current flows along the c axis.

Moreover, the present invention provides a method of cooling and a method of generating electric power, both of which use the thermoelectric conversion device. The method of cooling according to the present invention is such a method that, using the above-described thermoelectric conversion device, electric current is passed between the pair of electrodes to cause a temperature difference between the pair of electrodes, whereby one of the pair of electrodes is made a low temperature part. In an electric power generating method according to the present invention, using the above-described thermoelectric conversion device, heat is supplied between the pair of electrodes so as to cause a temperature difference therebetween, whereby a potential difference is caused between the pair of electrodes.

According to the present invention, higher thermoelectric conversion performance can be obtained in a wide temperature region than was conventionally possible by utilizing the thermoelectric conversion characteristic in the interlayer direction in which electrically conducting layers and electrically insulating layers are arranged alternately. This superiority is based on the interlayer conduction of a layered substance.

DESCRIPTION OF THE PREFERRED EMBODIMENTS

Hereinbelow, preferred embodiments of the present invention are described with reference to the drawings.

Embodiment 1

Figure 1:
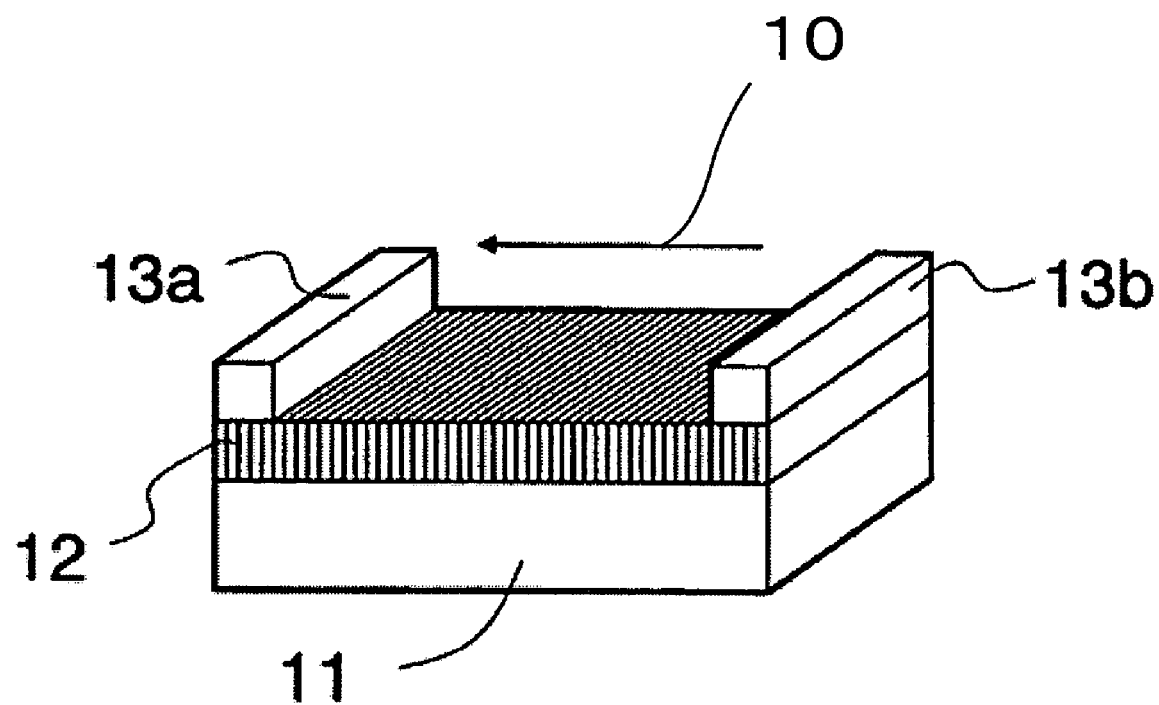
FIG. 1 is a perspective view illustrating one embodiment of a thermoelectric conversion device according to the present invention.

A thermoelectric conversion device shown in FIG. 1 is furnished with a plate-shaped substrate 11, a thermoelectric-conversion film 12 on the substrate 11, and a pair of electrodes 13a, 13b arranged to the right and left of the substrate 11 so as to be in contact with the thermoelectric-conversion film 12.

Figure 2:
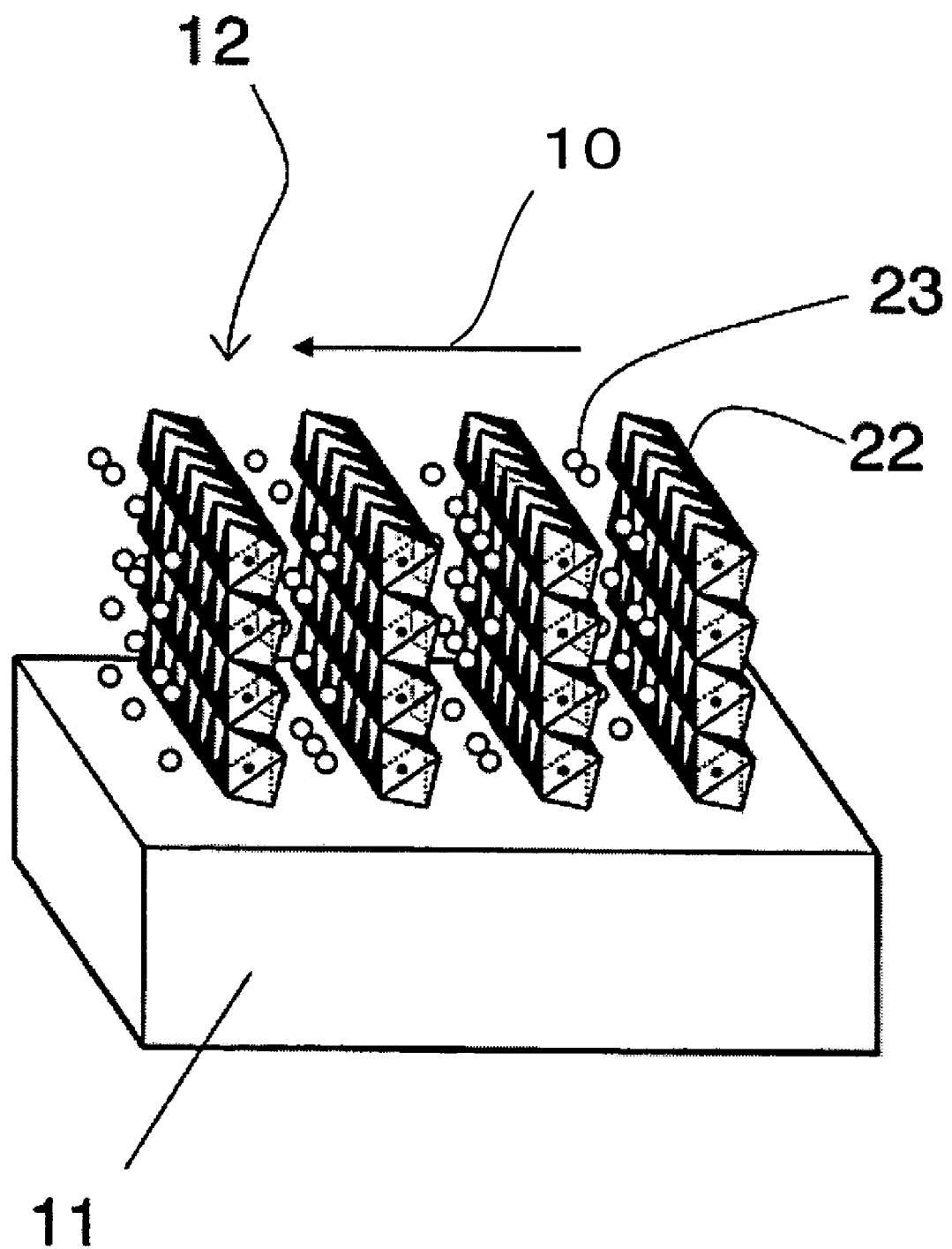
FIG. 2 is a view illustrating a crystal structure of a thermoelectric-conversion film in the thermoelectric conversion device shown in FIG. 1.

FIG. 2 illustrates a crystal structure of the thermoelectric-conversion film 12. The thermoelectric-conversion film 12 has a layered structure in which electrically conducting layers 22 and electrically insulating layers 23 are alternately arranged. In other words, the thermoelectric-conversion film 12 is made of a crystalline thin film in which the electrically conducting layers 22 and the electrically insulating layers 23 are alternately arranged.

In terms of crystallography, the interlayer direction, i.e., the direction perpendicular to the layer surfaces, is referred to as a c-axis direction 10. The pair of electrodes 13a and 13b are arranged so that current can be passed through along the c-axis direction 10.

The thermoelectric-conversion film 12 is an epitaxial thin film (epitaxially grown film) and has such an orientation that its c-axis direction 10 is along an in-plane direction of the substrate 11. In other words, the thermoelectric-conversion film 12 has such a crystal structure that respective layers 22 and 23 are grown substantially perpendicularly to a surface of the substrate 11.

The electrodes 13a and 13b need not be provided so as to be in contact with a surface of the thermoelectric-conversion film 12 as shown in FIG. 1, as long as the electrodes 13a and 13b are spaced apart with respect to the c-axis direction 10 so that current can flow through the thermoelectric-conversion film 12 along the c-axis direction 10 when voltage is applied between the electrodes.

The substrate 11 provides starting points of the epitaxial growth of the thermoelectric-conversion film 12. Preferable examples of the substrate 11 include single crystal substrates of $Al_2O_3$, $MgAl_2O_4$, $SrTiO_3$, $MgO$, $TiO_2$, or the like. It is also possible that a thermoelectric-conversion film epitaxially grown on a single crystal substrate is separated from the substrate and is arranged on another substrate 11 that has been separately prepared.

The thermoelectric-conversion film 12 is a crystalline thin film having a crystal structure in which the electrically conducting layers 22 and the electrically insulating layers 23 are alternately arranged, as shown in FIG. 2. A layered oxide substance is desirable since it is stable even in the air. As a layered substance that stands out in the thermoelectric conversion performance, the electrically conducting layer 22 has an octahedral (regular octahedron) crystal structure in which a transition metal atom M is positioned at its center and oxygen is positioned at its vertexes. It is preferable that the transition metal atom M be an element illustratively listed below, and particularly be one element selected from Co and Mn. Excellent thermoelectric conversion performance is obtained from the thermoelectric-conversion film 12 in which the electrically conducting layer 22 contains Co as a transition metal atom M and has a $CoO_2$ octahedral crystal structure in which edges are shared with one another. The structure in which $MO_2$ octahedrons are connected with sharing the edges one another to form a layer is called a $CdI_2$ structure.

An example of the thermoelectric-conversion film 12 in which the electrically conducting layer 22 has a $CdI_2$ structure is a film having a composition represented by the formula $A_{X1}MO_{Y1}$. This film is a layered substance in which a layer A, serving as the electrically insulating layer 23, and a layer $MO_{Y1}$, serving as electrically conducting layer 22, are arranged alternately.

In the formula, A is at least one element selected from an alkali metal, and an alkaline-earth metal, Hg, Tl, Pb, and Bi; examples of the alkali metal being Na, K, and Li, and examples of the alkaline-earth metal being Ca, Sr, and Ba. M is a transition metal element, preferably at least one element selected from Co, Ni, Ti, Mn, Fe, and Rh, and more preferably, at least one element selected from Co and Mn. Further, $0.1 \leq X1 \leq 0.8$, preferably $0.2 \leq X1 \leq 0.8$, and $1.5 \leq Y1 \leq 2.5$, preferably $1.8 \leq Y1 \leq 2.2$. The elements A and M may be two or more kinds, for example, the element A may be such a substance in which a portion of the alkali metal and/or the alkaline-earth metal is substituted by Hg, Tl, Pb, or Bi. It is preferable that Y1 be 2; however, it is difficult to set Y1 at precisely 2 because Y1 depends on the forming method or conditions of the film. In the following description, although there may be cases in which it is described as Y1=2 for convenience, it does not mean that Y2 should precisely be 2. On the other hand, X1 can be adjusted artificially to some extent. Additionally, it is also conceivable that S (sulfur) or Se (selenium) may be employed in place of O (oxygen) in the above formula.

The metal element A randomly occupies the sites in the crystal at a proportion of $(X1) \times 100\%$, and therefore, scattering of carriers occurs frequently. For this reason, even when an element that becomes a metal when in a simple element (metal element) is used as the element A, the layer A has an electrically insulative property. The layer formed of the metal element A has a function to supply carries (electrons in the film having a composition represented by the formula $A_{X1}MO_{Y1}$) to the electrically conducting layer 22 having an octahedral crystal structure in which a transition metal atom M is positioned at its center and oxygen is positioned at its vertexes. The layer having this function becomes insulative. To this extent, X1 may be 1.0; in other words, the metal element A may be positioned at all the sites in the crystal.

The thermoelectric-conversion film 12 having a composition represented by the formula $A_{X1}MO_{Y1}$ is, more specifically, an alternately layered material of electrically conducting layers 22 made of $MO_2$ in which each one layer is comprised of 1 to 3 monolayer(s), and electrically insulating layers 23 in which each one layer is comprised of 1 to 4 monolayer(s). It is difficult to fabricate a thermoelectric-conversion film 12 having an electrically conducting layer 22 with a thickness of 4 or more monolayers, or an electrically insulating layer 23 with 5 or more monolayers in the current state of the art, but it should be noted that such a film is not excluded from the scope of the present invention.

It should be noted that FIG. 2 illustrates a crystal structure in which the electrically conducting layers 22 and the electrically insulating layers 23 are arranged alternately one monolayer after another.

When a dc voltage is applied between the electrodes 13a and 13b, current flows along the c-axis direction of the thermoelectric-conversion film 12, accompanied by heat transfer, and as a result, heat absorption occurs on the electrode 13a side while heat generation occurs on the electrode 13b side. If the current is passed in the reverse direction, the heat generation and the heat absorption reverse.

When carriers are holes, heat absorption is caused on the electrode 13a side while heat generation is caused on the electrode 13b side by making the electrode 13a the positive electrode and the electrode 13b the negative electrode, respectively. When the element M is Ni, the carriers tend to be electrons. In this case, by making the electrode 13a the negative electrode and the electrode 13b the positive electrode, heat absorption is caused on the electrode 13a side while heat generation is caused on the electrode 13b side. Thus, the device shown in the figure can be used as a thermoelectric cooling device. It should be noted that when the electrode 13a and the electrode 13b need to be strictly distinguished, the former is referred to as a "first electrode (reference numeral: 13a)" and the latter is referred to as a "second electrode (reference numeral: 13b)".

To date, it has been believed that in a thermoelectric-conversion film 12 having a layered structure, the thermoelectric figure of merit ZT regarding the c-axis direction 10 is not sufficient for practical uses because the electric resistance is large and the Seebeck coefficient is small.

Through comprehensive studies and optimization on various conditions, the present inventors have succeeded in producing, on a substrate 11, a layered substance in which the interlayer direction (the c-axis direction 10) is along the in-plane direction. During the process of examining the relationship of thermoelectric conversion performance with orientations of external field using the layered substance as the thermoelectric-conversion film 12, the inventors also have found that an unexpectedly high thermoelectric figure of merit can be obtained in the interlayer orientation depending on the size of the external field.

One possible reason for this is a mechanism like thermoelectronic emission, but it is inferred that a complicated mechanism including the effect like tunneling conduction is also involved because, with this layered substance, the emission medium is not vacuum but the electrically insulating layer 23.

By causing a temperature difference between the electrodes 13a and 13b in the same configuration, carriers having thermal energy shift between the electrodes 13a and 13b within the thermoelectric-conversion film 12 in such a manner that the temperature difference is canceled out, causing electric current to flow therethrough consequently. Utilizing this effect, electric power can be taken out via the electrodes 13a and 13b. Thus, the device shown in the figure can also be used as a thermoelectric power generation device.

The present invention makes it possible to realize a high-efficiency device in which heat reversal is small because the gap between the electrodes 13a and 13b regarding the c-axis direction 10 of the thermoelectric-conversion film 12 can be freely set. Thereby, the temperature difference between the high temperature part and the low temperature part can be increased.

In order to obtain a thermoelectric-conversion film 12 that has a structure in which the layers 22 and 23 are erected perpendicular to the surface of the substrate 11 (cf. FIG. 2), i.e., a structure in which the c-axis direction 10 is along the in-plane direction, the material for the substrate 11 and the temperature of heating the substrate 11 in producing the thin film are important factors. In the case of using sputtering, it is generally preferable that the substrate temperature be within the range of 650° C. to 750° C., although it may depend on the type of element A.

As for the composition of the thin film, a film with good crystallinity can be obtained by employing the following ranges: for example, $0.3 \leq x \leq 0.6$ when the element A is Na, $0.3 \leq x \leq 0.5$ when the element A is Sr, and $0.4 \leq x \leq 0.7$ when the element A is Ca.

The method of forming the thermoelectric-conversion film 12 is not particularly limited and various methods can be used, including sputtering, evaporation, laser ablation, vapor deposition such as chemical vapor deposition, crystal growth from liquid phase or solid phase, and the like.

Preferable examples of the material for the substrate include single-crystal materials of sapphire $Al_2O_3$, MgO, $SrTiO_3$, $LaAlO_3$, $NdGaO_3$, $YAlO_3$, $LaSrGaO_4$, $LaSrAlO_4$, $MgAl_2O_4$, ZnO, $ZrO_2$, $TiO_2$, $Fe_2O_3$, $Cr_2O_3$, Si, GaAs, and the like, which show relatively good lattice matching between the substrate 11 and the thermoelectric-conversion film 12. It should be noted, however, that the crystal plane of the substrate needs to be selected appropriately. For example, it is difficult to orient the c-axis direction 10 in an in-plane direction of the substrate if a $Na_{x1}CoO_{y1}$ film is formed on a sapphire C plane. In this case, it is necessary to select a sapphire A plane or a sapphire M plane.

It is also possible to obtain the thermoelectric-conversion film 12 by forming, on the substrate 11, a film having a structure in which the c-axis direction 10 is along an in-plane direction in advance and thereafter making the film into a thick film by a liquid-phase epitaxial process or the like. This method makes it possible to have a large effective area of the electric current or heat flow that flows between the layers, and therefore achieves more efficient thermoelectric conversion. As for the liquid phase process, the following process may be employed when, for example, an a-axis oriented $Na_{0.5}CoO_2$ thin film in which the layers are erected perpendicularly is used. The thin film is immersed together with the substrate into a melt in which powders of $Co_3O_4$ and $Na_2CO_3$ are mixed using NaCl as a flux and melted at 1000° C., and then gradually cooled to 900° C.; thus, a $Na_{0.5}CoO_2$ thick film with a thickness of about 1 mm can be obtained.

Figure 3:
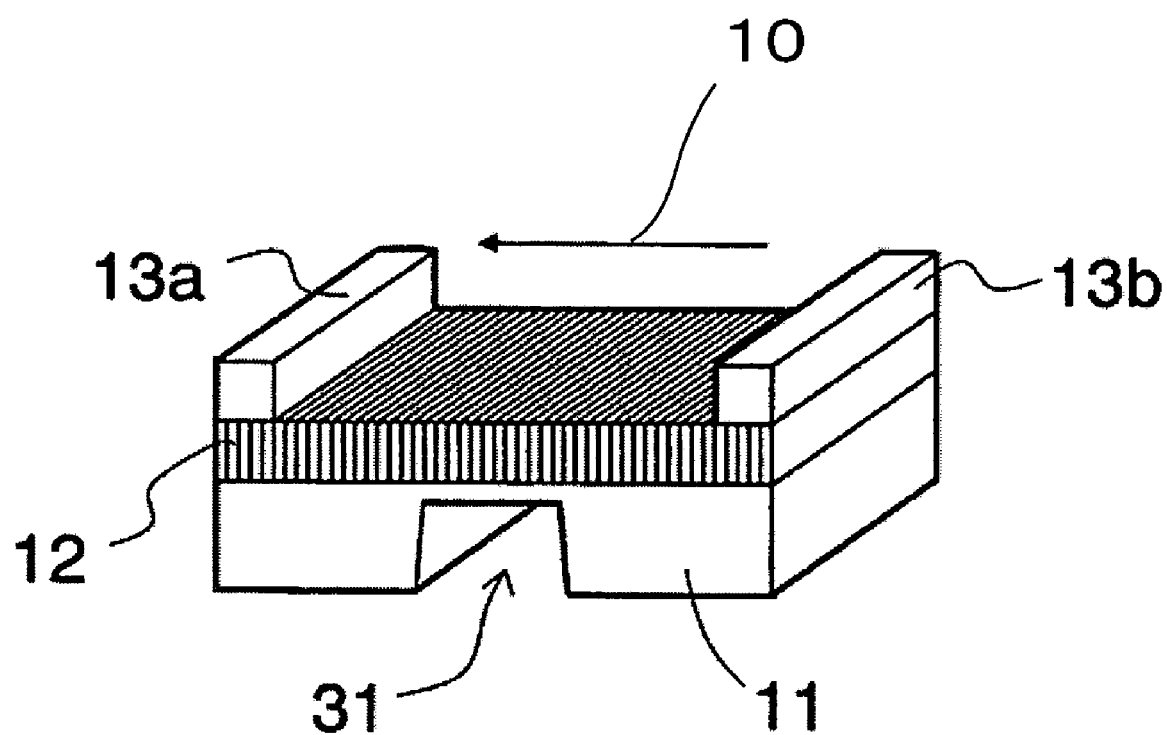
FIG. 3 is a perspective view illustrating another embodiment of a thermoelectric conversion device according to the present invention.

In the thermoelectric conversion device according to the present invention, the thickness of the substrate 11 may be reduced in a portion of a region sandwiched between the pair of the electrodes 13a and 13b. FIG. 3 illustrates a substrate 11 having a constricted structure 31 as an example.

The processing of the substrate 11 may be carried out from a back surface of the substrate (the surface that is opposite the surface on which the thermoelectric-conversion film 12 has been formed) by mechanical grinding using a diamond wheel or the like, chemical etching, ion beam etching, or the like. Due to the constricted structure 31 thus formed, it is possible to suppress the reduction of temperature difference (heat loss) that occurs in the thermoelectric-conversion film 12 due to the heat conduction by the substrate 11. When the thermoelectric-conversion film 12 is thick, the constricted structure 31 may be encroached on the thermoelectric-conversion film 12 (see also FIG. 4(c), which will be discussed later). That is, the thickness of the substrate 11 may be 0 locally. As shown in FIG. 3, it is preferable that the thickness of the substrate 11 be reduced in a region 31 that traverses across the substrate 11 so as to cross the c-axis direction 10.

The thermoelectric-conversion film 12 can be obtained through epitaxial growth, but it is unnecessary to employ a substrate that provides starting points of the epitaxial growth (growth substrate) as the device's substrate (working substrate) 11. In other words, after epitaxially growing the thermoelectric-conversion film 12 on a growth substrate, the film may be removed from the growth substrate and transferred onto a working substrate. The removal of the growth substrate can be performed by grinding of the growth substrate, separating the film from the growth substrate, or the like; specifically, it may be carried out by laser irradiation, exposure to water vapor, electrical discharge machining, or the like. If a substrate made of resin, glass, or the like having a low thermal conductivity, particularly a resin substrate, is used as the working substrate 11, a thermoelectric conversion device with a small heat loss can be attained.

The supporting of the thermoelectric-conversion film 12 by the working substrate may be started either before or after the removal of the growth substrate. For example, the thermoelectric-conversion film 12 may be separated from the growth substrate while supporting the film by the resin substrate that later serves as the working substrate; or alternatively, after separating the thermoelectric-conversion film 12 from the growth substrate, the film may be arranged on the resin substrate that later serves as the working substrate.

The thermoelectric conversion device according to the present invention may also include a buffer layer arranged between the substrate 11 and the thermoelectric conversion layer 12.

Figure 4A:
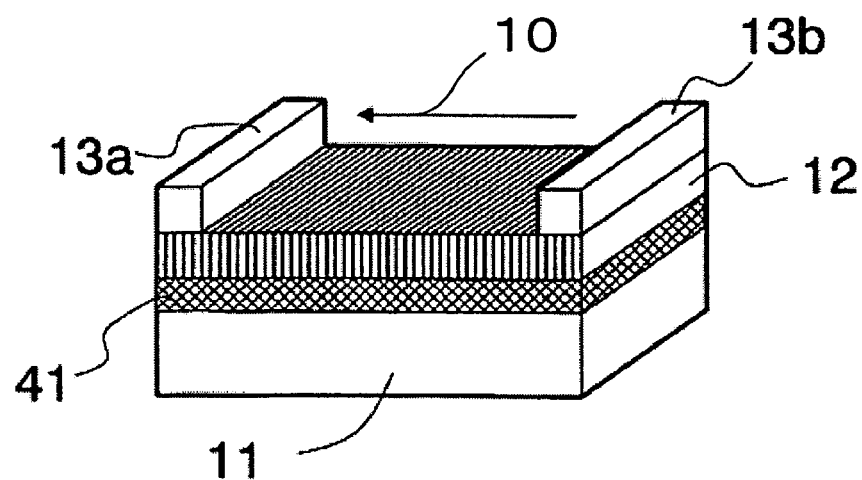
FIG. 4A is a perspective view illustrating one embodiment of a thermoelectric conversion device having a buffer layer.
Figure 4B:
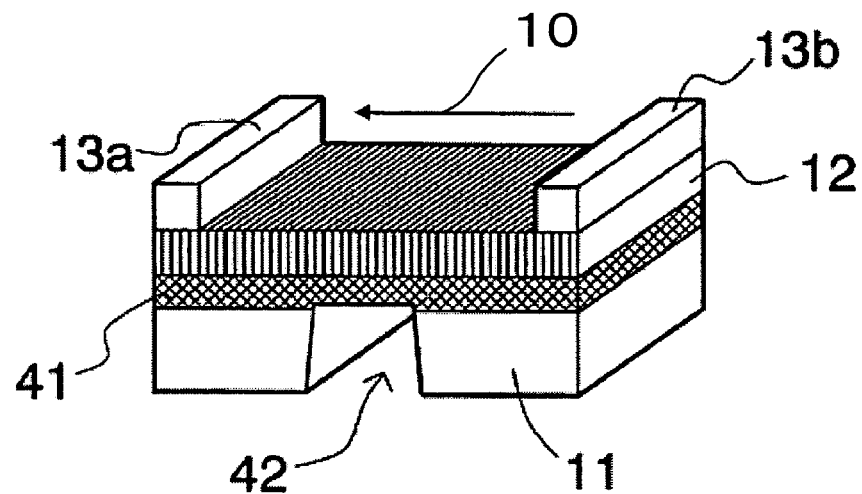
FIG. 4B is a perspective view illustrating another embodiment of a thermoelectric conversion device having a buffer layer.
Figure 4C:
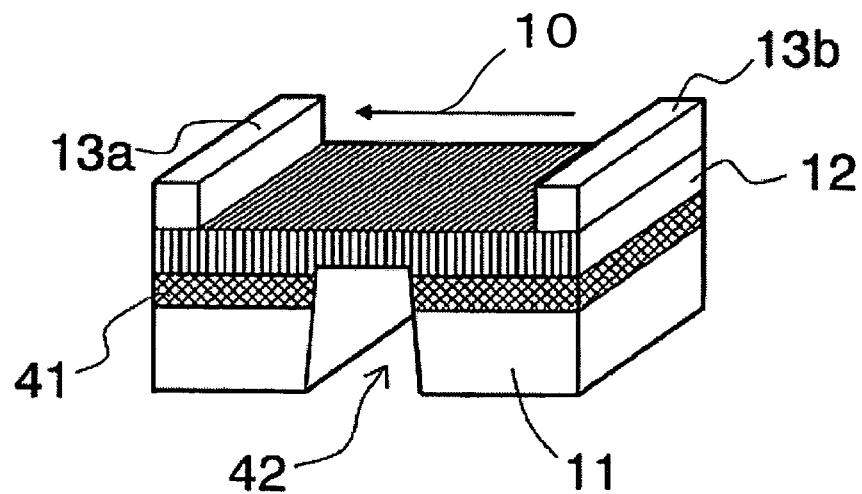
FIG. 4C is a perspective view illustrating still another embodiment of a thermoelectric conversion device having a buffer layer.

An example of the thermoelectric conversion device including a buffer layer is shown in FIGS. 4A to 4C. First, an underlying buffer layer 41 is epitaxially grown on a substrate 11, and using the underlying buffer layer 41 as a template, a thermoelectric-conversion film 12 in which the c-axis direction 10 is along an in-plane direction is epitaxially grown (FIG. 4A).

In this case, there are no restrictions as to the substrate 11 as long as the underlying buffer layer 41 can be epitaxially grown, and a semiconductor substrate such as Si may be used in addition to the substrates as illustratively mentioned above. Examples of the material for the underlying buffer layer 41 include oxides and metals, and specifically, may include a material containing at least one selected among $CeO_2$, $ZrO_2$, $TiO_2$, ZnO, NiO, $Fe_2O_3$, $Cr_2O_3$, $Al_2O_3$, $Cr_2O_3$, Cr and Pt.

The use of the underlying buffer layer 41 in growing the thermoelectric-conversion film 12 makes the removal of the substrate 11 easy and thus increases the degree of freedom in device configurations.

The underlying buffer layer may be applied to the embodiment in which the thickness of the substrate 11 is reduced in a portion thereof. For example, in the case where the substrate 11 is ground by such a technique as ion beam etching, the substrate 11 can be ground accurately if a means for detecting the element that forms the underlying buffer layer 41 is provided. If the deepest portion of the constricted structure 42 is kept within the underlying buffer layer 41 by this grinding, a thermoelectric conversion device can be obtained in which the substrate 11 is divided (the thickness of the substrate 11 is partially made zero) while the thickness of the thermoelectric-conversion film 12 is maintained (FIG. 4B).

When a metal film is used as the underlying buffer layer 41, it is recommended that the underlying buffer layer 41 be divided together with the substrate 11 by the constricted structure 42 to prevent electrical short circuit between the high temperature part and the low temperature part (FIG. 4C).

The underlying buffer layer 41 may be a multi-layered film in which two or more layers are stacked.

In the foregoing, the description has been made mainly on a thermoelectric-conversion film having a composition represented by the formula $A_{X1}MO_{Y1}$, but it should be understood that the thermoelectric-conversion film 12 according to the present invention is not limited thereto.

An illustrative example of another electrically conducting layer 22 having an octahedral crystal structure in which a transition metal atom M is positioned at its center may include a layer having a perovskite structure.

The electrically insulating layer 23 may be composed of a single metal element, like the layer A. In this case, the metal element may be at least one element selected from an alkali metal, an alkaline-earth metal, Bi, Pb, Hg, and Tl, and this electrically insulating layer may be composed of 1 to 3 monolayer(s). The electrically insulating layer 23 may be composed of a crystalline metal oxide. In this case, this electrically insulating layer may be composed of 1 to 4 monolayer(s).

The electrically insulating layer may have a rock-salt structure. The rock-salt structure may be composed of metal atoms and oxygen atoms, and for example, may have a composition represented by at least one formula selected from $Sr_2(Bi_{2-X4}Pb_{X4})_2O_4$, $Ca_2(Co_{1-X5}Cu_{X5})_2O_4$, $(Ca,Bi)_2CoO_3$, and $Sr_2TiO_3$, where $0 \leq X4 \leq 1$ and $0 \leq X5 \leq 1$.

Another example of the thermoelectric-conversion film 12 includes a film having a composition represented by the formula $Bi_{2-X2}Pb_{X2}Sr_2CO_2O_{Y2}$, where $0 \leq X2 \leq 0.5$ and $7.5 \leq Y2 \leq 8.5$. This film has, for example, a layered structure of a $CoO_2$ electrically conducting layer and an insulating layer having a 4-monolayer rock-salt structure, as will be described layer.

Still another example of the thermoelectric-conversion film 12 includes a film having a composition represented by the formula $(Ca_{1-X3-Y3}Sr_{X3}Bi_{Y3})_3Co_4O_9$, where $0 \leq X3 \leq 1$ and $0 \leq Y3 \leq 0.3$. This film has, for example, a layered structure of a $CoO_2$ electrically conducting layer and an insulating layer having a 3-monolayer rock-salt structure, as will be described layer.

The thermoelectric-conversion film 12 may be a film in which the electrically conducting layer 22 contains at least one element selected from cobalt and manganese and has a perovskite structure or a $CdI_2$ structure, and the electrically insulating layer 23 contains at least one element selected from an alkali metal, an alkaline-earth metal, Bi, Pb, Hg, and Tl and has a rock-salt structure.

The thermoelectric conversion element according to the present invention utilizes the physical properties of a layered substance in the interlayer directions, and for this purpose, it is desirable that the distance between the electrodes be longer while the electrode areas be smaller. The reason is as follows. The actual thermal conduction K is represented as $K = \kappa \cdot S_0/l$, where $\kappa$ is thermal conductivity, and $S_0$ and $l$ are the area and the length of the element, respectively. In a thermoelectric conversion device, it is preferable that the thermal conduction be smaller in order to prevent the reduction of the temperature difference produced by the Peltier effect. To reduce the actual thermal conduction, the element should have a longer length and a smaller area. For this reason, it is desirable that the element be processed into a thin shape in use. With a small element such as a thin film, the performance can be enhanced by a processing such as a photolithography technique.

In the thermoelectric conversion device of the present invention, it is easy to keep a sufficient element length 1 since electric current is passed in the film plane directions, not in the film thickness directions of the thermoelectric-conversion film. In the case of an epitaxially grown film in which the c axis is oriented perpendicular to the substrate surface, the element length l is restricted by the film thickness and it is difficult to make it 1 mm or greater. In contrast, the thermoelectric conversion device of the present invention can make the element length l 1 mm or greater, preferably 3 mm or greater, more preferably 5 mm or greater, and especially preferably 9 mm or greater. Specifically, it is recommended that the pair of the electrodes 13a and 13b be arranged so as to be spaced apart at a predetermined distance or greater, for example, 1 mm or greater with respect to the c-axis direction 10.

A method of cooling and a method of generating electric power according to the present invention may be carried out by applying conventionally-performed methods to the thermoelectric conversion device according to the present invention. In cooling, it is recommended that a pulse current be passed between the pair of the electrodes 13a and 13b. The use of pulse current makes it possible to perform cooling that makes use of the high thermoelectric conversion performance of the thermoelectric conversion device according to the present invention while suppressing the amount of heat generated. Although the amount of heat flow does not reduce significantly even with the use of pulse current since the heat flow that is transferred depends on the integral value of the current that passes through, the use of pulse current can suppress the generation of Joule heat arising from electric resistance.

Hereinbelow, the present invention will be described in further detail with reference to Examples thereof, but it is to be construed that the following Examples are merely illustrations of preferred embodiments of the present invention.

EXAMPLE 1

A film of layered oxide $Na_{0.4}CoO_2$ was deposited on a 10 mm-square and 100-μm-thick A plane substrate of sapphire $Al_2O_3$. The deposition was carried out by RF magnetron sputtering using a 4-inch-diameter $Na_{0.5}CoO_2$ sintered compact target.

Pre-sputtering was carried out at an output power of 60 W for 1 hour in an atmosphere gas containing 80% Ar and 20% $O_2$ that was kept at 5.0 Pa. Thereafter, deposition was performed on the substrate heated to 700° C. over a duration of 5 hours under the same conditions as in the pre-sputtering. Subsequently, the heated thin film on the substrate was cooled for 2 hours to room temperature in an oxygen atmosphere. Consequently, a thin film having metallic luster and a film thickness of 1000 nm was obtained.

Energy dispersive X-ray fluorescence analysis confirmed that the composition ratio of Na and Co in the thin film was approximately Na:Co=0.4:1.

Figure 5:
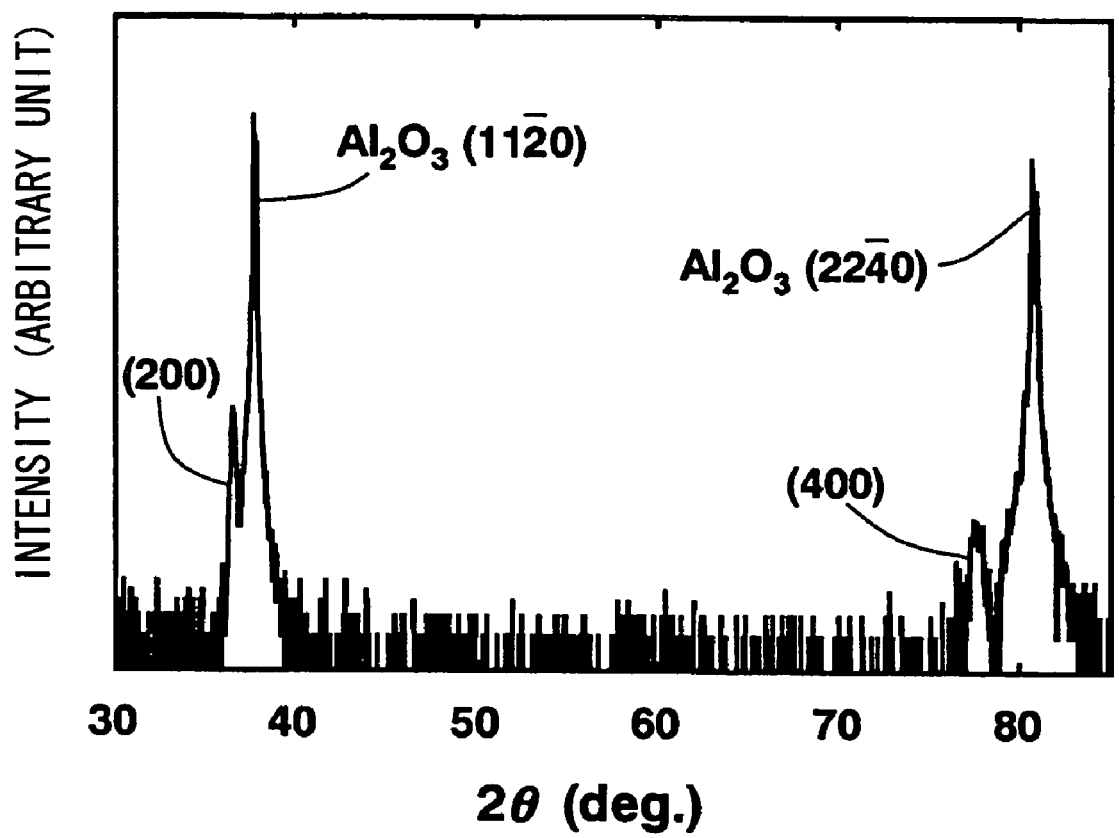
FIG. 5 is a view illustrating the result of X-ray diffraction analysis for a $Na_{0.4}CoO_2$ thin film of Example 1.

The result of the X-ray diffraction analysis for the $Na_{0.4}CoO_2$ thin film thus obtained is shown in FIG. 5.

Besides the diffraction peaks originating from the sapphire substrate, the same series of peaks were observed, which were due to the diffraction from the thin film. These were the (200) peak and the (400) peak.

This confirmed that the $Na_{0.4}CoO_2$ thin film was epitaxially grown in such a manner that the crystal was oriented so that the (100) plane became parallel to the substrate surface. Moreover, four-axis x-ray diffraction analysis confirmed that the c axis of the $Na_{0.4}CoO_2$ crystal was oriented in an in-plane direction of the thin film.

The crystal orientation of this $Na_{0.4}CoO_2$ thin film with respect to the substrate is the same as in FIG. 2. With the crystal having such an orientation, the measurement of its physical properties is possible regarding two directions, the c-axis direction and the direction perpendicular to the c axis, i.e., the direction parallel to the layers.

Figure 6:
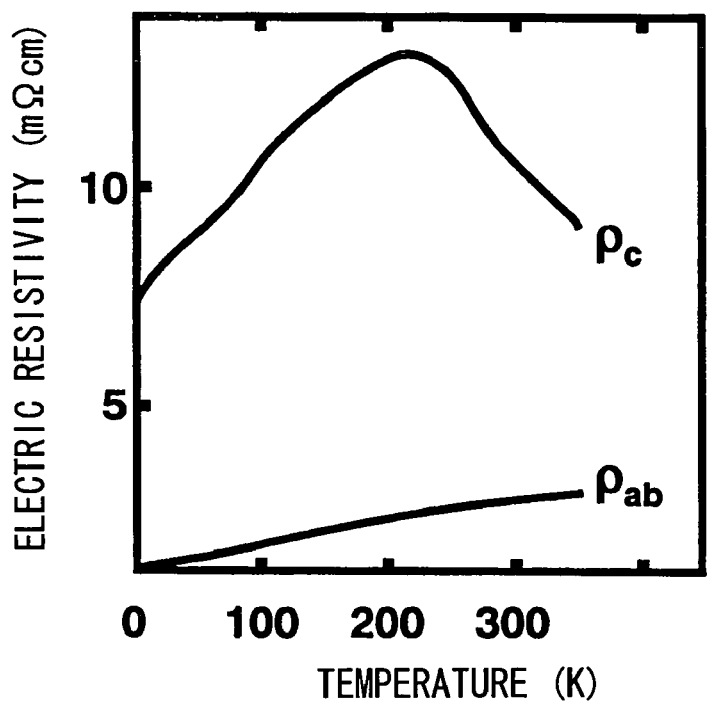
FIG. 6 is a view illustrating the temperature dependence of electric resistivity of the $Na_{0.4}CoO_2$ thin film of Example 1.

FIG. 6 shows the temperature dependence of the electric resistivities of the $Na_{0.4}CoO_2$ thin film measured regarding respective directions. Here, the curve $\rho_c$ indicates the electric resistivity regarding the c-axis direction, that is, the interlayer direction of the respective layers. The curve $\rho_{ab}$ indicates the electric resistivity regarding the direction parallel to the layers.

Figure 7:
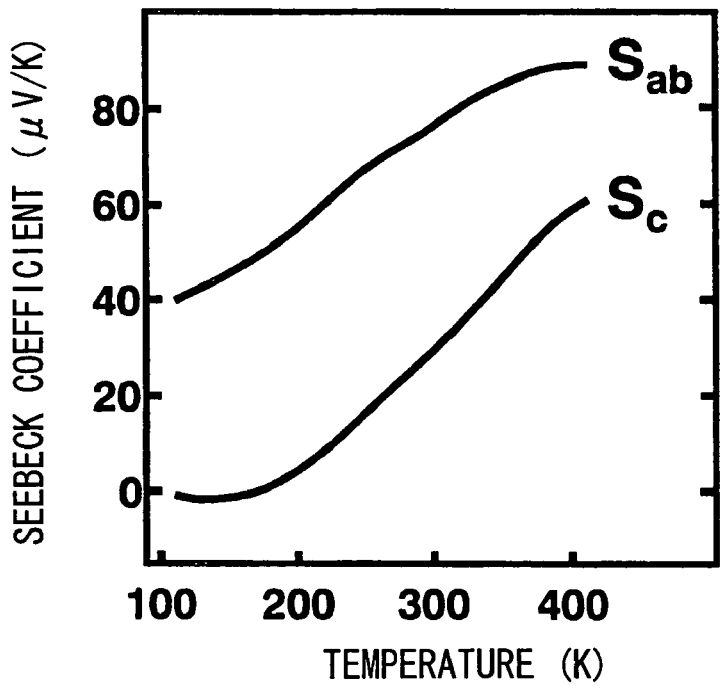
FIG. 7 is a view illustrating the temperature dependence of Seebeck coefficient of the $Na_{0.4}CoO_2$ thin film of Example 1.

FIG. 7 shows the temperature dependence of the Seebeck coefficients of the $Na_{0.4}CoO_2$ thin film. Here, the curve $S_c$ represents the Seebeck coefficients regarding the interlayer direction, and the curve $S_{ab}$ represents the Seebeck coefficients regarding the direction parallel to the layers.

If the results shown above are accepted as they are, the following assumption will hold. The assumption is that the directions parallel to the layers show lower electric resistivities and greater Seebeck coefficients, and therefore result in better thermoelectric conversion characteristics than are obtained from the interlayer directions, in which the electric resistivities are higher and the Seebeck coefficients are less.

Figure 8A:
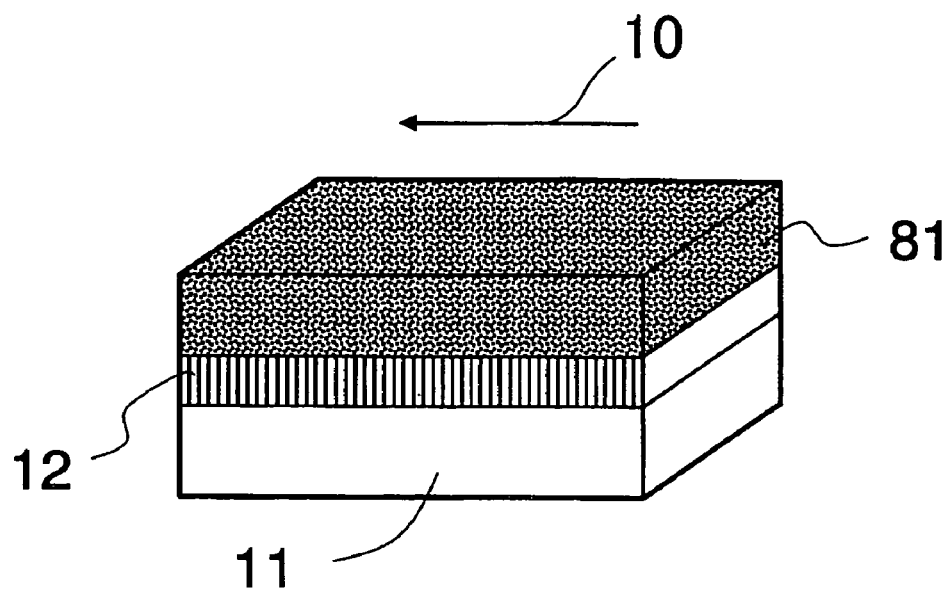
FIG. 8A is a perspective view illustrating the state in which an epoxy resin is coated on the $Na_{0.4}CoO_2$ thin film in Example 1.
Figure 8B:
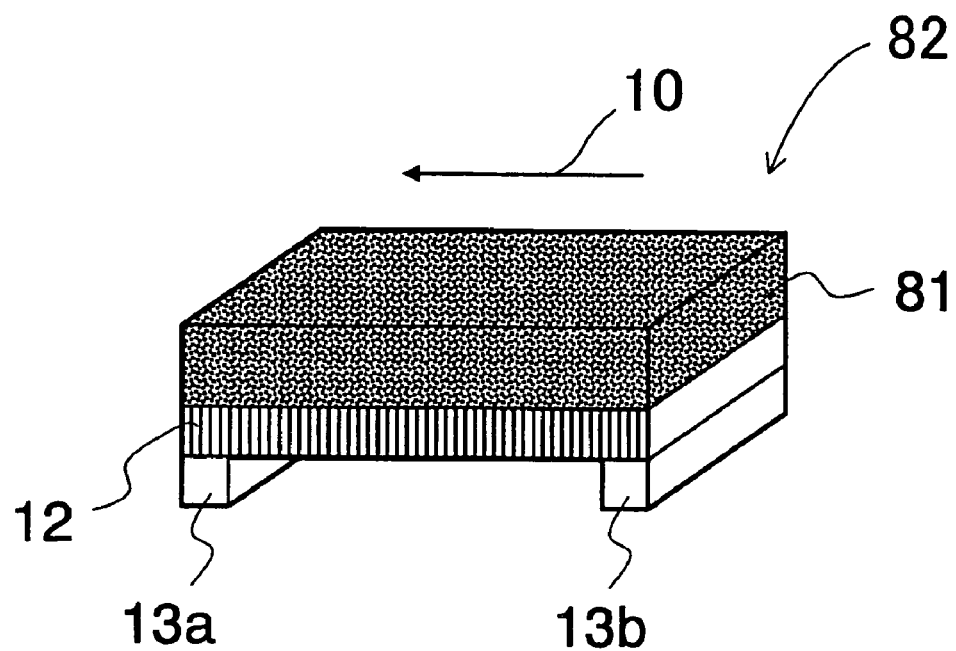
FIG. 8B is a perspective view illustrating a thermoelectric conversion device of Example 1 that employees an epoxy resin as the substrate.

In order to verify the validity of this assumption under practical use conditions, a thermoelectric conversion device was fabricated. First, as shown in FIG. 8A, an epoxy resin was coated on a thermoelectric-conversion film ($Na_{0.4}CoO_2$ thin film) 12 and solidified to form a support member 81. Next, a layered material composed of substrate 11/thermoelectric-conversion film 12/support member 81 was set aside for 30 hours in a hermetically sealed vessel containing water vapor.

As a result, water molecules permeated into the interface between the $Na_{0.4}CoO_2$ thin film 12 and the sapphire substrate 11, and thereby stress was applied to the thin film to peel off the $Na_{0.4}CoO_2$ thin film 12 from the sapphire substrate 11.

Further, on the reverse surface of the thermoelectric-conversion film ($Na_{0.4}CoO_2$ thin film) 12 that is opposite to the support member 81, Pt electrodes 13a, 13b having a width of 0.5 mm and a thickness of 500 nm were deposited by sputtering so that a 9-mm gap was maintained with respect to the c-axis direction 10. Thus, a thermoelectric conversion device 82 having a newly-provided substrate 81 made of the epoxy resin was obtained.

The resistance value between the two Pt electrodes 13a and 13b was about 100 Ω at room temperature. When a 0.1-mA dc current was steadily passed between the electrodes, a temperature difference of about 3° C. was produced therebetween. When the direction of the current was reversed, the high temperature part and the low temperature part accordingly reversed.

The temperature difference calculated taking into account the thermoelectric performance ($\rho_c$, $S_c$) regarding the c-axis direction, shown in FIGS. 6 and 7, the effect of the heat loss by the substrate, and the like, is 1° C. or less. This means that the experimental value resulted in as great as three times or greater that of the conversion efficiency expected from the steady-state thermoelectric performance.

Generally, the thermoelectric figure of merit ZT has a term that is the square of the Seebeck coefficient; therefore, when the physical quantity corresponding to the Seebeck coefficient results in three times or greater, it means that ZT improves about one order of magnitude greater.

The reason why the actually measured value deviated from the assumed value from FIGS. 6 and 7 will be analyzed below (see Example 4).

EXAMPLE 2

Using a 4-inch target material composed of a sintered compact made of powders of $CaO_2$ and $Co_3O_4$, a thin film having a film thickness of 1000 nm was grown on a sapphire M-plane substrate of 10 mm square and 100 μm thick under the same sputtering conditions as in Example 1.

Figure 9:
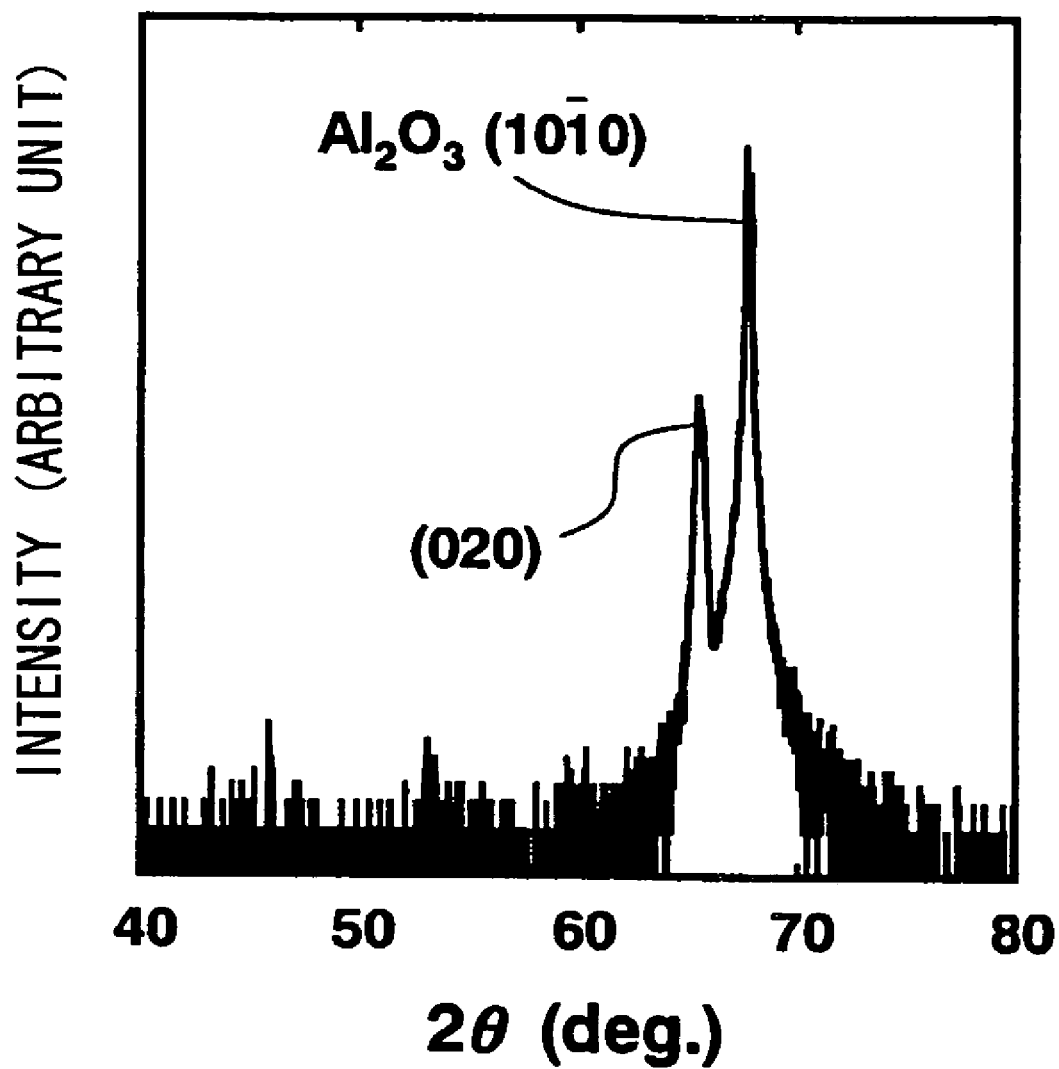
FIG. 9 is a view illustrating the result of X-ray diffraction analysis for a $Ca_{0.5}CoO_2$ thin film of Example 2.

Energy dispersive X-ray fluorescence analysis confirmed that the composition ratio of Ca and Co in this thin film was approximately Ca:Co=0.5:1. The result of X-ray diffraction analysis for this $Ca_{0.5}CoO_2$ thin film is shown in FIG. 9. Besides the diffraction peak originating from the sapphire substrate, only the peak indexed as (020) due to the diffraction from the thin film was observed.

This demonstrated that the $Ca_{0.5}CoO_2$ thin film was epitaxially grown so that its (010) plane became parallel to the substrate. In addition, four-axis x-ray diffraction analysis confirmed that the c axis of the crystal of $Ca_{0.5}CoO_2$ oriented in the plane of the thin film.

The $Ca_{0.5}CoO_2$ thin film had shown a light brown color immediately after the thin film was produced, but the $Ca_{0.5}CoO_2$ thin film turned to a black color with metallic luster after it was annealed at 300° C. for 2 hours in an oxygen atmosphere.

Figure 10:
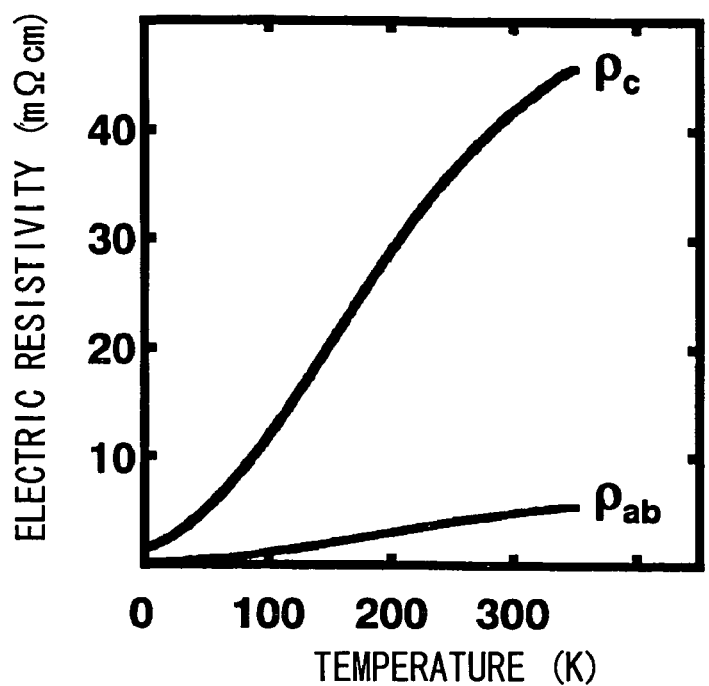
FIG. 10 is a view illustrating the temperature dependence of electric resistivity of the $Ca_{0.5}CoO_2$ thin film of Example 2.

FIG. 10 shows the temperature dependence of the electric resistance of the $Ca_{0.5}CoO_2$ thin film. Here, the curve pc represents the electric resistivity in the c-axis direction, i.e., in the interlayer direction of the layered substance composed of the Ca layer and the Co layer, and the curve $\rho_{ab}$ represents the electric resistivity in the direction parallel to the layers.

Figure 11:
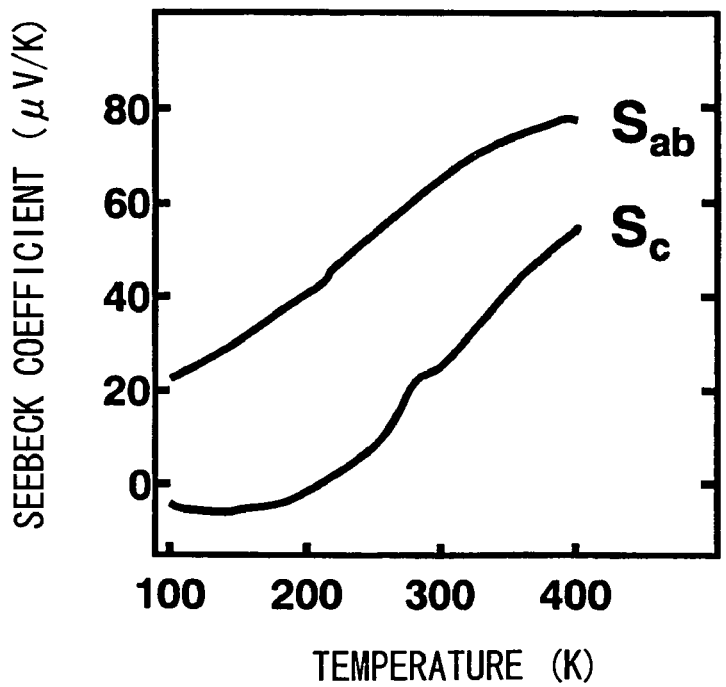
FIG. 11 is a view illustrating the temperature dependence of Seebeck coefficients of the $Ca_{0.5}CoO_2$ thin film of Example 2.

FIG. 11 shows the temperature dependence of the Seebeck coefficient of the $Ca_{0.5}CoO_2$ thin film. Here, the curve $S_c$ represents the Seebeck coefficient regarding the c-axis direction, and the curve $S_{ab}$ represents the Seebeck coefficient in the direction parallel to the respective layers.

Further, Au electrodes having a width of 0.5 mm and a thickness of 400 nm were deposited on the thin film by sputtering so that a gap of 9 mm was kept therebetween along the c-axis direction of the $Ca_{0.5}CoO_2$ thin film. In addition, in order to alleviate the effect of immediate loss of the generated temperature difference due to the heat conduction through the substrate, the substrate was thinned by ion beam etching to a thickness of about 1 µm in a region with a width of about 2 mm that traverses across the area between the electrodes, as shown in FIG. 3.

The resistance value between the two Au electrodes was about 400 Ω at room temperature. When a current of 0.003 mA was steadily passed between the electrodes, a temperature difference of about 2° C. was produced between opposite ends. The temperature difference calculated taking into account the thermoelectric figure of merit in the c-axis direction shown in FIGS. 10 and 11, the effect of heat loss due to the substrate, and the like, is 0.1° C.; therefore, the experimental value resulted in as great as 20 times that of the theoretical value. The temperature difference actually obtained that was converted into a figure of merit of thermoelectric conversion ZT, was 400 times.

EXAMPLE 3

Figure 12A:
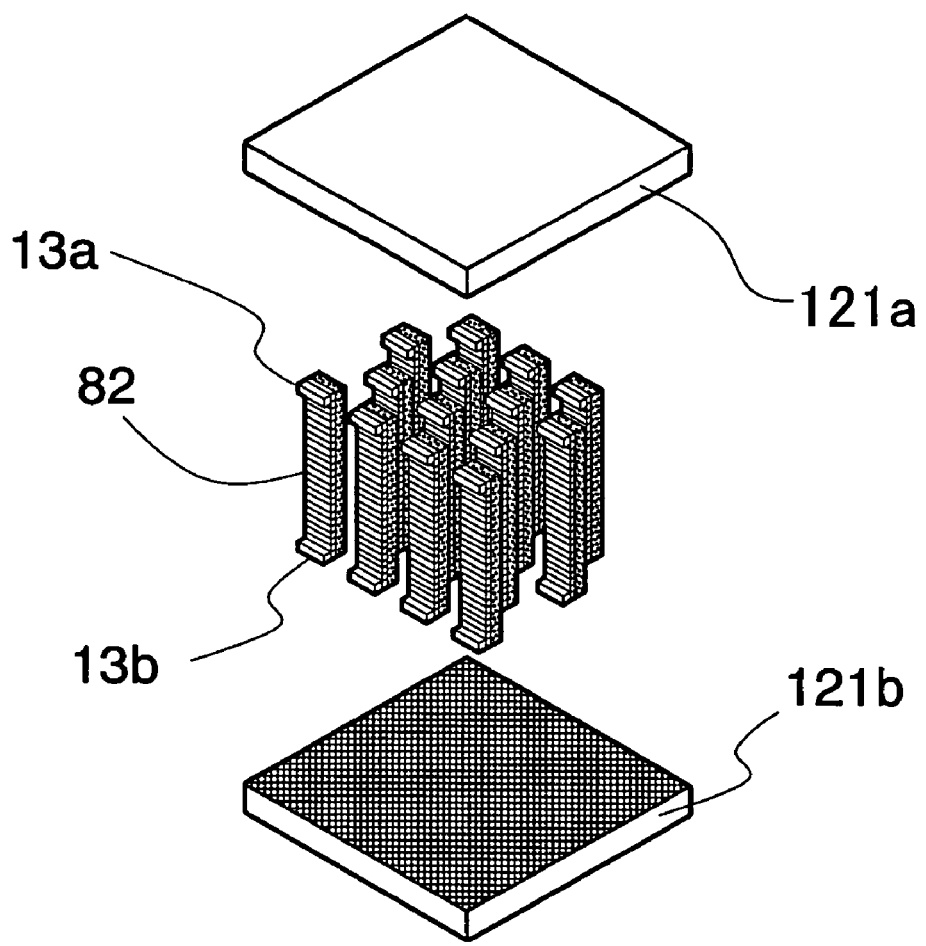
FIG. 12A is a perspective exploded view showing the components of a thermoelectric conversion device of Example 3 for illustrating the configuration thereof.

A device having a larger effective area was fabricated using a plurality of thermoelectric conversion devices obtained according to Example 1. Specifically, 1000 pieces of thermoelectric conversion elements 82 each of which has a distance between the electrodes 13a and 13b of 30 mm, a width of 5 mm, and a thickness of 2 mm, were prepared, in addition to a heat-absorbing plate 121a and a heat-dissipating plate 121b, both of which were made of 700-mm-square alumina, as shown in FIG. 12A.

Alumina was used for the material for the heat-absorbing plate 121a and the heat-dissipating plate 121b because alumina has a high thermal conductivity, leading to a uniform temperature distribution.

The surfaces of the heat-absorbing plate 121a and the heat-dissipating plate 121b were coated with copper, which has a high electric conductivity, to electrically connect the thermoelectric conversion elements 82 with one another.

Figure 12B:
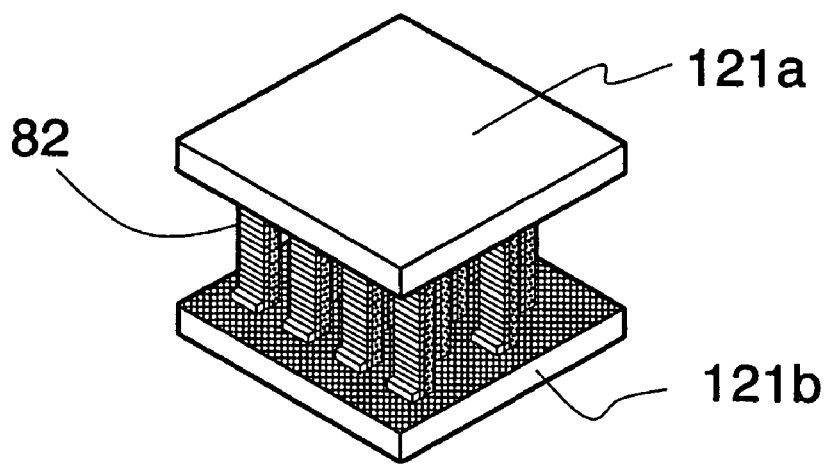
FIG. 12B is a perspective view illustrating the thermoelectric conversion device of Example 3.

Using silver paste, the electrodes 13a and 13b of each of the thermoelectric conversion devices 82 and the surfaces of the heat-absorbing plate 121a and the heat-dissipating plate 121b coated with copper were joined together to obtain a thermoelectric conversion device shown in FIG. 12B. In this device, a plurality of thermoelectric conversion devices provided by the present invention are joined electrically in parallel between the heat-absorbing plate 121a and the heat-dissipating plate 12b. This device had a cooling capacity of about 3° C. per 1 mW power.

EXAMPLE 4

The present example deals with an example of a single crystal of and an epitaxially grown film of a layered oxide represented by the composition formula $Bi_{2-X2}Pb_{X2}Sr_2Co_2O_{Y2}$ (wherein X2=0.4 etc. and Y2=7.5 to 8.5) and describes the thermoelectric conversion characteristics of this substance.

A single crystal of $Bi_{2-X2}Pb_{X2}Sr_2Co_2O_Y$ (wherein X2=0.4 etc. and Y2=7.5 to 8.5) was formed by a floating zone method. A precursor of $Co(NO_3) \cdot H_2O$ as well as $PbO_2$, SrO, and BiO were weighed according to the composition and thereafter mixed together, and then the temperature was elevated to 200° C. to dry the mixture. The resultant powder was shaped into a pellet form, sintered at 1000° C. for 24 hours in the atmosphere, and again made into a powder form. The resultant powder was pressed to fit the rod size of the device, sintered at 1150° C. for about 15 hours, and thereafter grown into a crystal in an oxygen atmosphere at 3 atm, thus yielding a single crystal with black luster and having a length of 4 to 6 mm and a radius of 5 mm.

Figure 13:
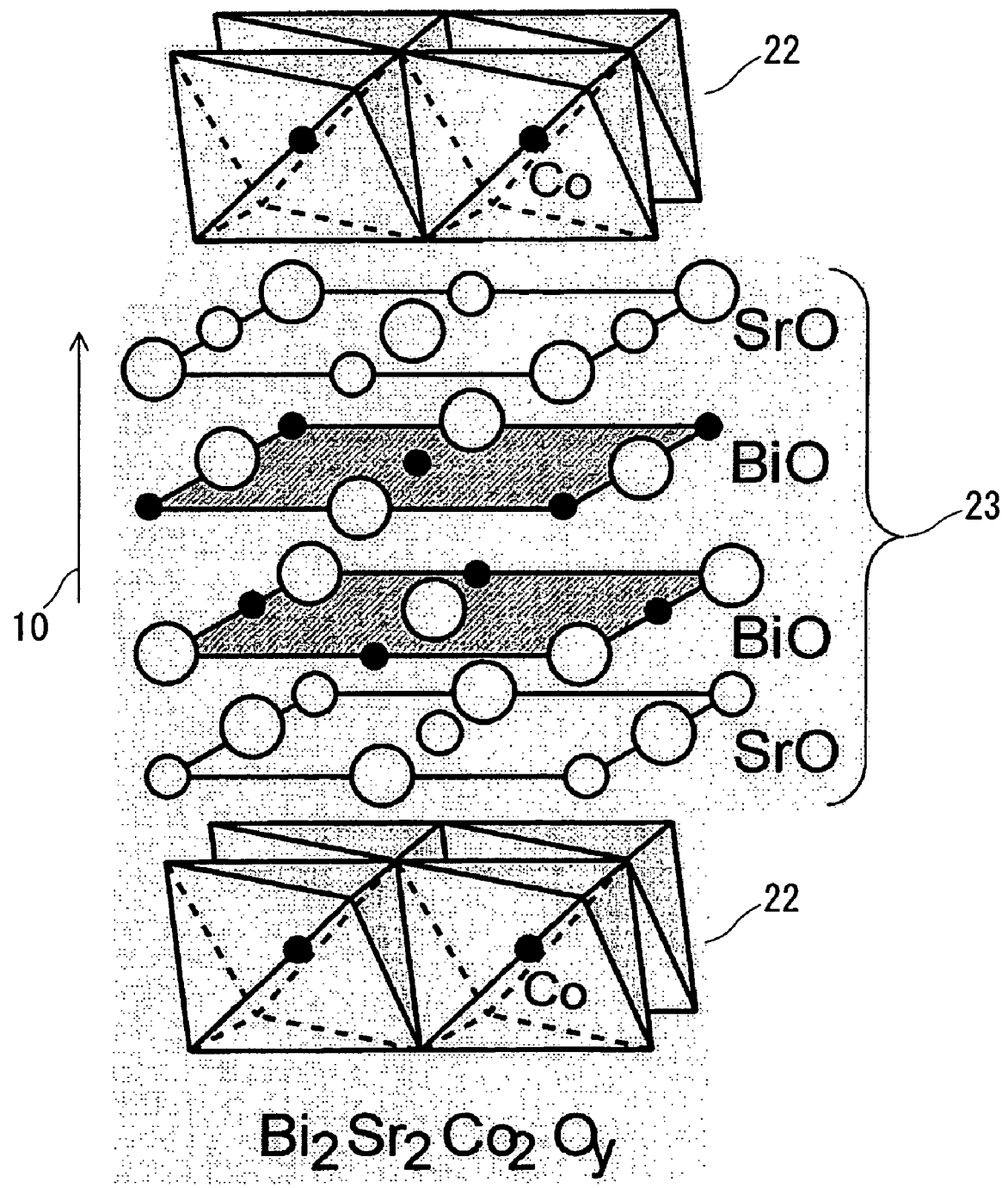
FIG. 13 is a view illustrating a crystal structure of $Bi_{2-X}Pb_XSr_2CO_2O_Y$ single crystal of Example 4.
Figure 15A:
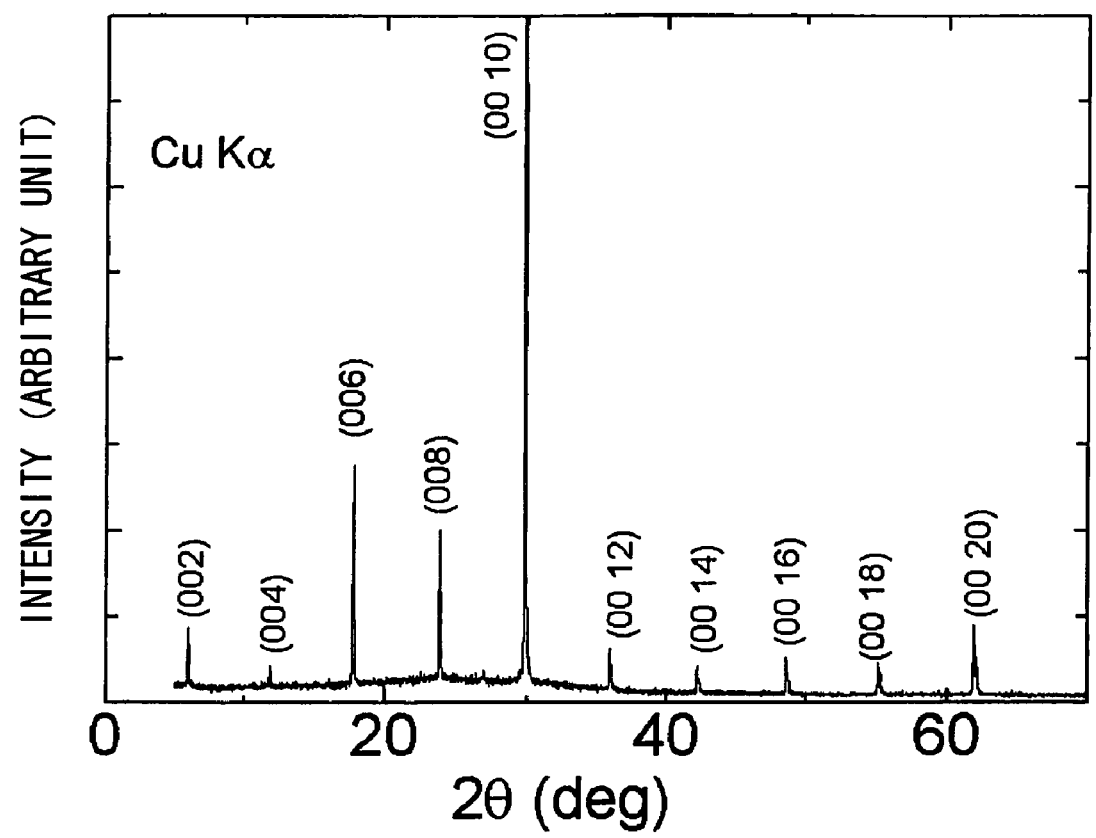
FIG. 15A is a view illustrating the result of X-ray diffraction analysis for a $Bi_{1.6}Pb_{0.4}Sr_2Co_2O_Y$ single crystal of Example 4.
Figure 15B:
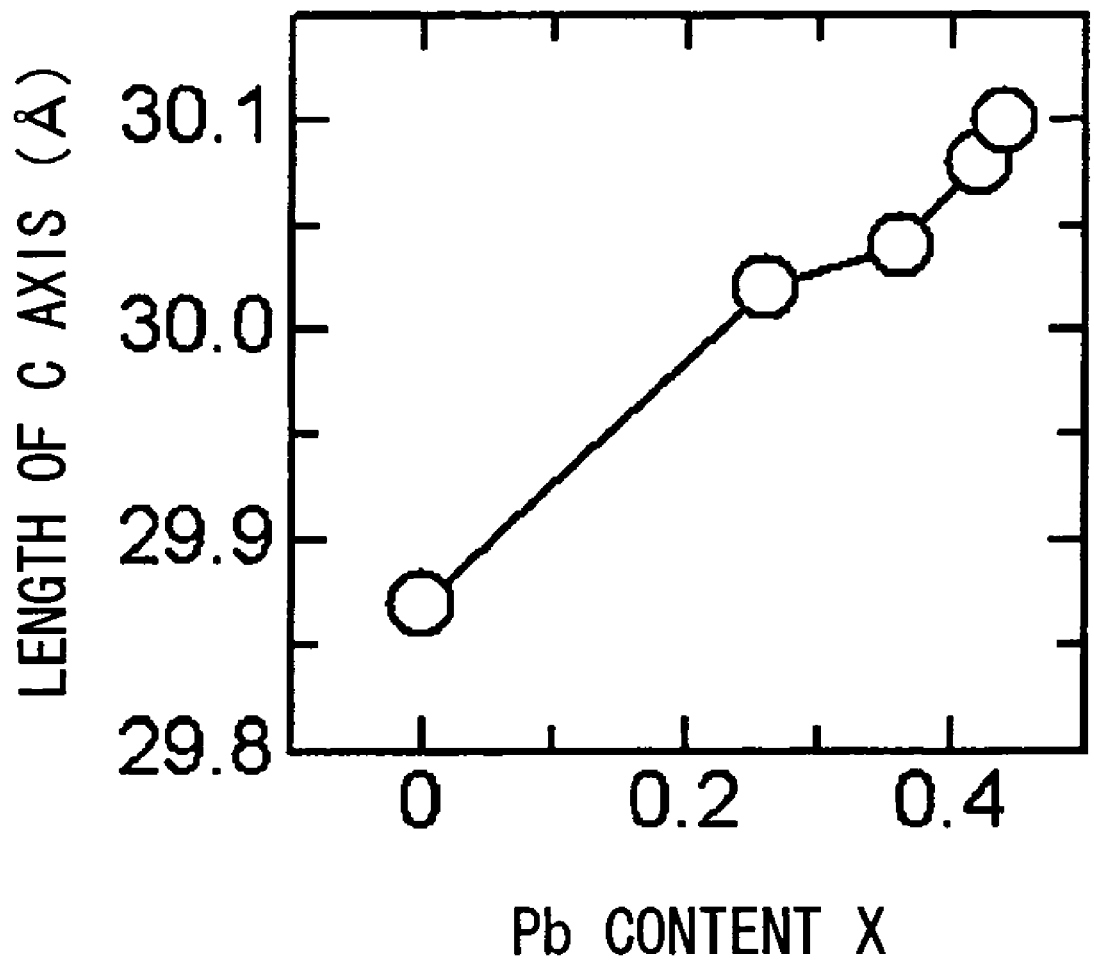
FIG. 15B is a view illustrating the relationship between Pb content X and c axis length of the $Bi_{2-X}Pb_XSr_2Co_2O_Y$ single crystal of Example 4.
Figure 16A:
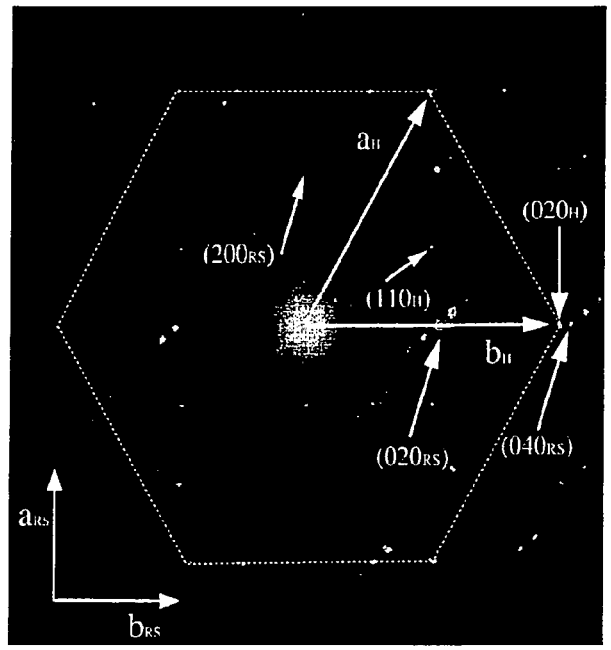
FIG. 16A shows a Laue diffraction pattern obtained from the $Bi_2Sr_2Co_2O_Y$ single crystal of Example 4.
Figure 16B:
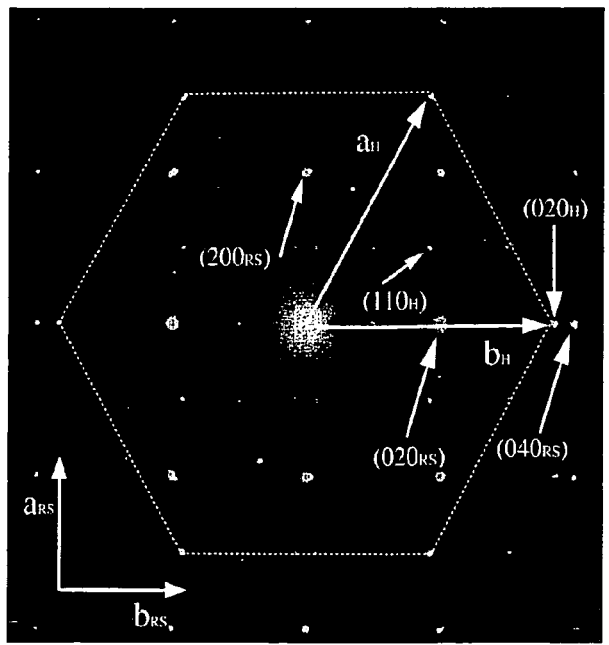
FIG. 16B shows a Laue diffraction pattern obtained from the $Bi_{1.8}Pb_{0.2}Sr_2Co_2O_Y$ single crystal of Example 4.

The crystal structure is shown in FIG. 13. In the present example, a crystal in which the Bi sites in the crystal shown in FIG. 13 are partially substituted by Pb was also used in order to further stabilize the crystal. The crystal structure of the resultant substance was confirmed by X-ray diffraction analysis, the result of which is shown in FIG. 15A. The data shown in FIG. 15A corresponds to the single crystal wherein X2=0.4. FIG. 15B shows the relationship between the Pb contents X (X2) and the c axis lengths of the crystal, obtained by the analysis. In addition, Laue diffraction images are shown in FIGS. 16A and 16B.

The composition of the crystal obtained was confirmed by ICP (inductively coupled plasma emission spectroscopy) and EDX (electron dispersive X-ray spectroscopy). The amount of oxygen in the actual crystal should be Y2=8 if it is produced as the composition formula, but in reality, a greater amount of oxygen is contained in many cases. The amount of oxygen is difficult to identify even with the use of ICP or EDX, and therefore, Y2 is indicated as 7.5 to 8.5.

Figure 14:
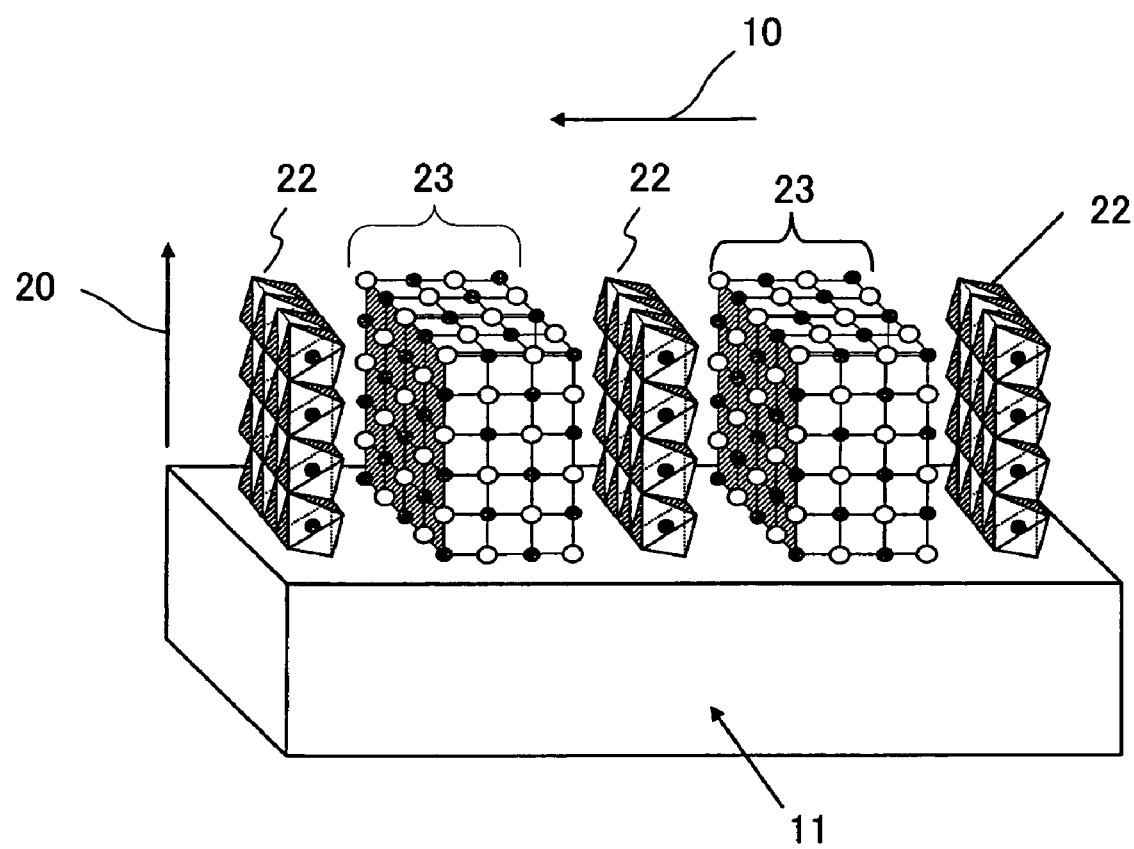
FIG. 14 is a view illustrating a crystal structure of a $Bi_{2-X}Pb_XSr_2CO_2O_Y$ epitaxially grown film of Example 4.
Figure 17:
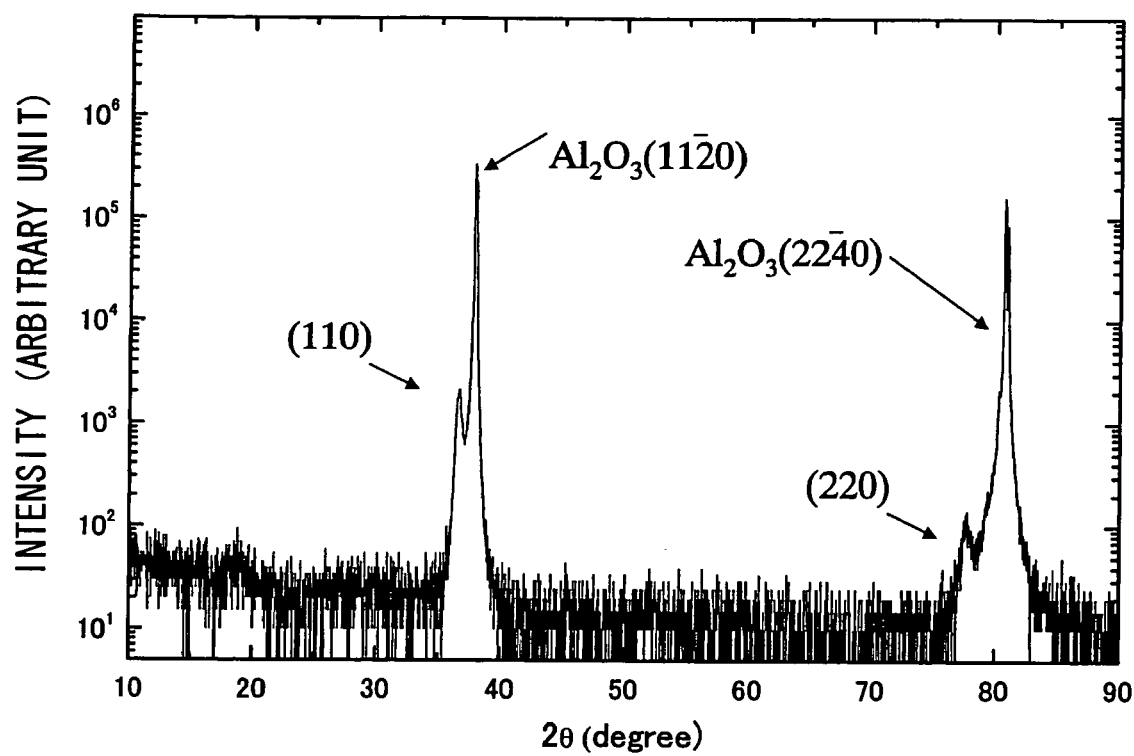
FIG. 17 is a view illustrating the result of X-ray diffraction analysis for the $Bi_2Sr_2CO_2O_Y$ epitaxially grown film of Example 4.

Although a fabricating method of a single crystal of $Bi_{2-x}Pb_xSr_2Co_2Oy_2$ (wherein x=0.4 etc. and Y2=7.5 to 8.5) has been described hereinabove, it was also possible to obtain $Bi_2Sr_2Co_2O_Y$ (wherein y=7.5 to 8.5) on a sapphire A plane substrate through epitaxial growth (FIG. 14). Specifically, using a 4-inch material target made of a sintered compact of BiO, SrO, and $Co_3O_4$ powders, pre-sputtering was carried out for 1 hour at an output power of 60 W in an atmosphere gas of 80% Ar and 20% $O_2$ that was kept at 5.0 Pa. Thereafter, deposition was carried out on the sapphire A plane substrate heated to 700° C. over a duration of 5 hours under the same conditions as the pre-sputtering. Subsequently, the substrate was cooled for 2 hours in an oxygen atmosphere to room temperature, and consequently, a thin film having metallic luster and a film thickness of 1000 nm was obtained. The X-ray diffraction data of the thin film thus obtained are shown in FIG. 17.

Next, the measurement method and measurement results will be described. It should be noted that the following description will discuss the measurement method and measurement results for the case of single crystal since almost the same results were obtained for both cases of the single crystal and the epitaxially grown film.

The single crystal obtained in the above-described manner was cleaved at a cleavage plane and the surface was finished to be planar. Thereafter, an electrode and a thermocouple made of chromel-constantan were attached with silver paste on opposite sides of the cleavage plane. The temperature difference was measured in this state by applying an electric field in the interlayer direction of the electrically conducting layer and the electrically insulating layer. The dimensions of the element here was 2.0 mm×2.0 mm×0.2 mm. Next, the element to which the electrodes were attached was transferred into a Dewar flask and placed into a vacuum of about $2\times 10^{-4}$ torr. Here, the sample was placed in a floating manner in order to prevent heat leakage as much as possible.

A power supply and a thermometer were connected outside the Dewar flask and current was passed through the element to measure a temperature difference between the opposite sides of the cleavage plane. When a current of 10 mA was passed between the electrodes, the opposite ends of the element showed a temperature difference of about 2 K. When the direction of the current was reversed, the high temperature part and the low temperature part accordingly reversed. Even when the temperature was reduced from room temperature to 50 K, a temperature difference of 2 K was obtained likewise.

When current is passed through an isolated system, the relationship $STI=K\Delta T$, where S is Seebeck coefficient and K is thermal conduction, holds between the current passed and the temperature difference. The equation demonstrates that through thermal conductivity, the energy infused by electric current shows up as a temperature difference, and the equation also forms the basis of a measurement method for measuring thermal conductivity, referred to as a Harman method. Here, thermal conduction K can be represented as $K=\kappa\cdot S_0/l$ with the thermal conductivity $\kappa$ and the area $S_0$ and the length l of the element.

Figure 18:
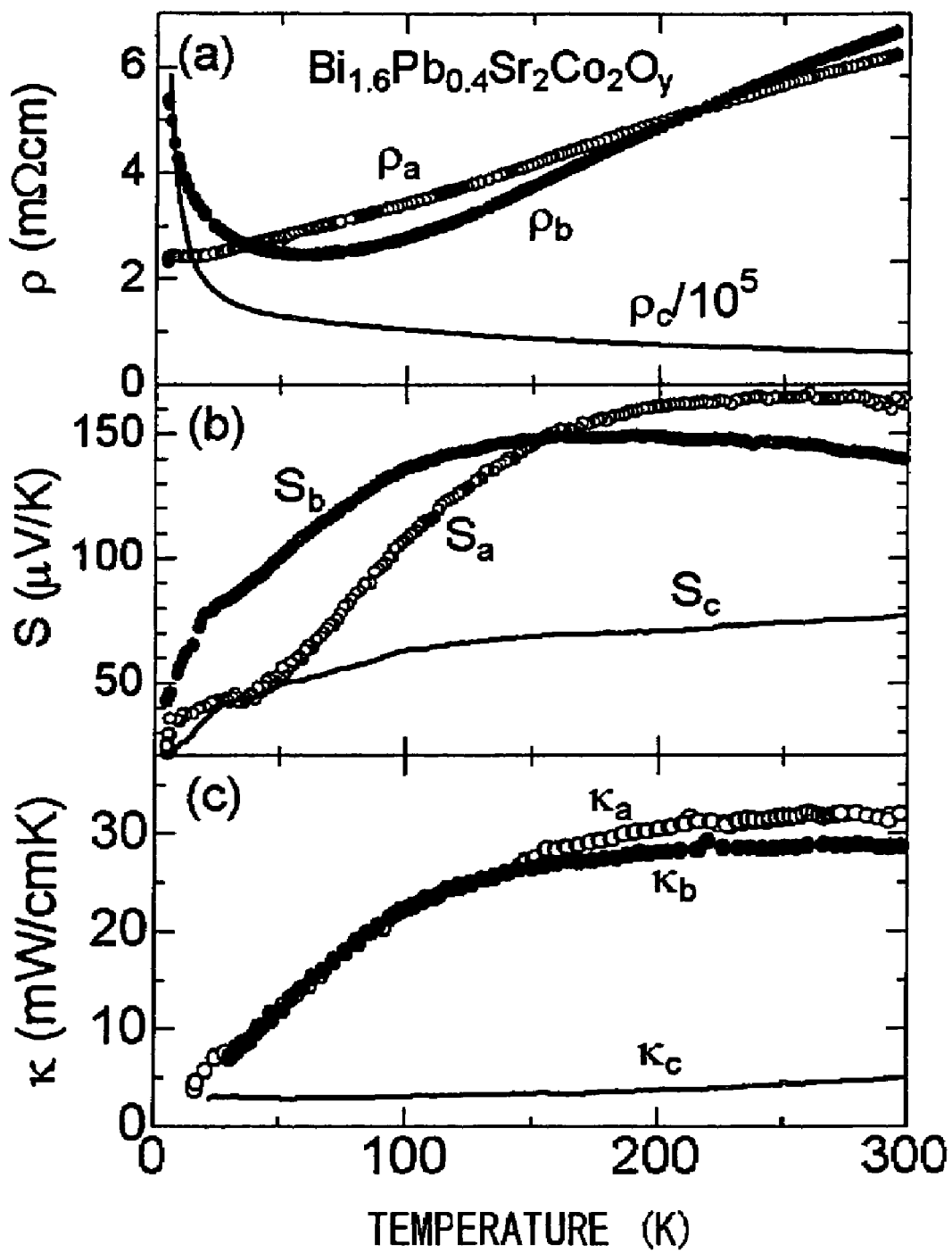
FIG. 18 is a view illustrating the temperature dependence of electric resistivity ρ, Seebeck coefficient S, and thermal conductivity κ of the $Bi_{1.6}Pb_{0.4}Sr_2CO_2O_Y$ single crystal of Example 4.

The electric resistivity $\rho$, the Seebeck coefficient S, and the thermal conductivity $\kappa$ for respective directions of the $Bi_{1.6}Pb_{0.4}Sr_2Co_2O_{y2}$ (wherein Y2=7.5 to 8.5) that has been obtained to the present are shown in FIG. 18. Both the values of the Seebeck coefficient S and the thermal conductivity $\kappa$ are obtained by a technique called a steady-state method, and they are obtained through measuring the thermal electromotive force and the temperature difference by creating a temperature difference of about 0.1 K between opposite sides of the element in a thermal equilibrium state.

As a result of a steady-state method at room temperature, the temperature difference $\Delta T$ estimated from the relationship $STI=K\Delta T$ using $\kappa$ of 5 mW/cmK and S of 100 µV/K is 0.06 K. This demonstrates that the actually measured value in the present example shows a temperature difference of about 30 times greater than the estimated value.

This is due to the face that a voltage of about 10 µV is applied to the element when measuring a thermal electromotive force and a temperature difference with creating a temperature difference of about 0.1 K, whereas voltage of as great as about 0.5 mV is applied thereto when a current of 10 mA is passed therethrough. This means that the measurement in the Examples of the present invention in which current is passed gives a far greater perturbation to the system than does the measurement in the normal steady-state method. It is believed that the current applied in the present example exceeded the potential barrier between the electrically conducting layer and the insulating layer that was not exceeded by the steady-state method, and therefore, the thermoelectric conversion effect due to the effects of tunneling current or electron emission that were beyond the normal electrical conduction effect was observed.

The present example yielded a S/K value about 30 times greater that of the measurement result obtained by the steady-state method; however, it will be more rational to believe that the Seebeck coefficient S increased about 30 times than to consider that the heat conduction K reduced to about 1/30. In terms of figure of merit, this result means that the figure of merit $ZT=S^2/\rho\kappa$ became about 900 times greater than that obtained by the measurement in the steady-state method.

Thus, the thermoelectric conversion characteristic along the interlayer direction of a layered substance in which electrically conducting layers and electrically insulating layers are arranged alternately is, in terms of the figure of merit ZT, as great as about 900 times that of the thermoelectric conversion performance that is measured by the minute temperature difference in a normal thermal equilibrium state and obtained by the steady-state method.

In contrast to the foregoing example, as for the thermoelectric figure of merit in in-plane directions of the electrically conducting layer, it was found that the data obtained through the Harman method, in which the measurement is performed with passing current as in the present example, are in good agreement with the data obtained by the steady-state method in which a minute temperature difference is produced in a thermal equilibrium state.

Thus, the difference in thermoelectric conversion characteristics due to the difference in the magnitude of perturbation is a particular phenomenon in the interlayer directions, and it is to be understood through newly-provided effects of tunneling current and electron emission phenomenon. It was found that by these effects, the thermoelectric conversion characteristic in the interlayer directions of the electrically conducting layer and the electrically insulating layer became as great as about 900 times that of the thermoelectric conversion performance obtained by the steady-state method in terms of the figure of merit ZT, and high performance comparable to ZT>1 was achieved in a wide temperature range of from 50 K to 800 K.

EXAMPLE 5

The present example describes the thermoelectric performance of $Ca_3Co_4O_9$ epitaxially grown on a substrate.

Figure 19:
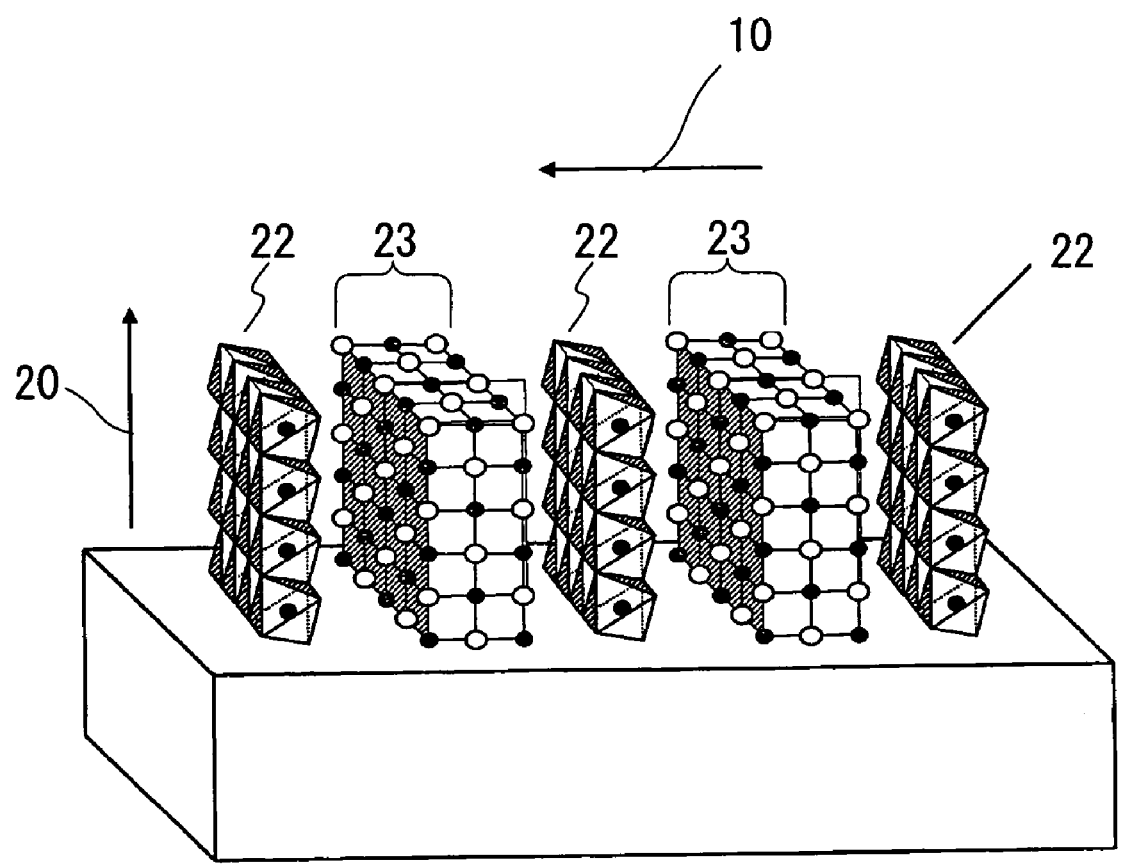
FIG. 19 is a view illustrating a crystal structure of a $Ca_3Co_4O_9$ epitaxially grown film of Example 5.

FIG. 19 illustrates a $Ca_3Co_4O_9$ thin film epitaxially grown on a substrate 11, according to the present example. $Ca_3Co_4O_9$ has $CoO_2$ layers as electrically conducting layers 22, and three-layer rock-salt structures represented by the formula $Ca_2CoO_3$ as electrically insulating layers 23. The a-axis direction 20 of the crystal of this thin film is perpendicular to the surface of the substrate 11 (in other words, the crystal is a-axis oriented), and the c-axis direction 10 is along an in-plane direction. The substrate used was an A plane substrate of sapphire $Al_2O_3$.

Using a 4-inch material target made of a sintered compact of $Co_3O_4$ and $CaO_2$ powders, pre-sputtering was carried out at an output power of 60 W for 1 hour in an atmosphere gas of 80% Ar and 20% $O_2$ that was kept at 5.0 Pa. Thereafter, the film was deposited on the substrate heated to 700° C. over a duration of 5 hours under the same conditions as the pre-sputtering. Thereafter, the film was cooled for 2 hours to room temperature in an oxygen atmosphere, and consequently, a thin film having metallic luster and a film thickness of 1000 nm was obtained.

Figure 20:
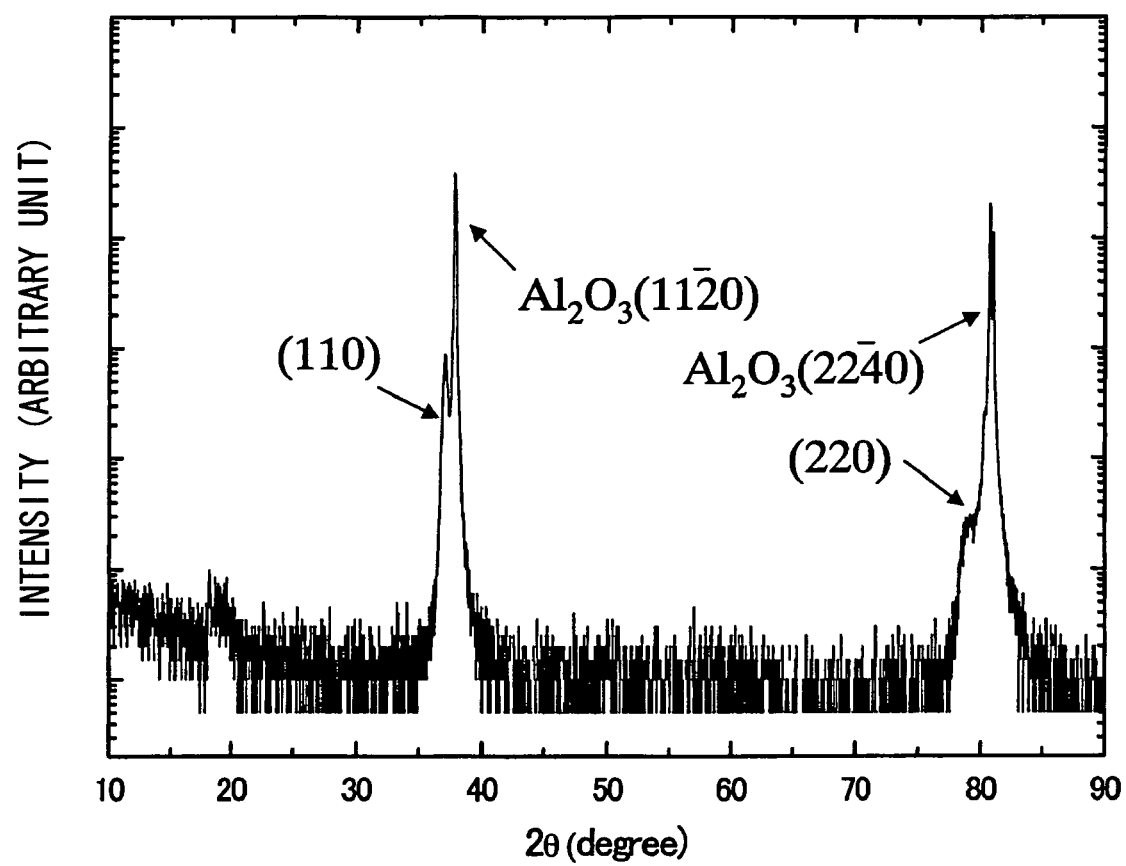
FIG. 20 is a view illustrating the result of X-ray diffraction analysis for the $Ca_3Co_4O_9$ epitaxially grown film of Example 5.

The result of X-ray diffraction analysis for the $Ca_3Co_4O_9$ thin film thus obtained is shown in FIG. 20. Besides the diffraction peaks originating from the sapphire substrate, the same series of peaks were observed, which were due to the diffraction from the thin film. These were the (110) peak and the (220) peak. This confirmed that the $Ca_3Co_4O_9$ thin film was epitaxially grown in such a manner that the crystal was oriented so that the (110) plane became parallel to the substrate surface. Moreover, four-axis x-ray diffraction analysis confirmed that the c axis of the $Ca_3Co_4O_9$ crystal was oriented within the plane of the thin film.

With the crystal being oriented as illustrated in FIG. 19, the measurement of its physical property is possible in two directions, the c-axis direction and the direction perpendicular to the c axis, i.e., the direction parallel to the $CoO_2$ layer.

Figure 21:
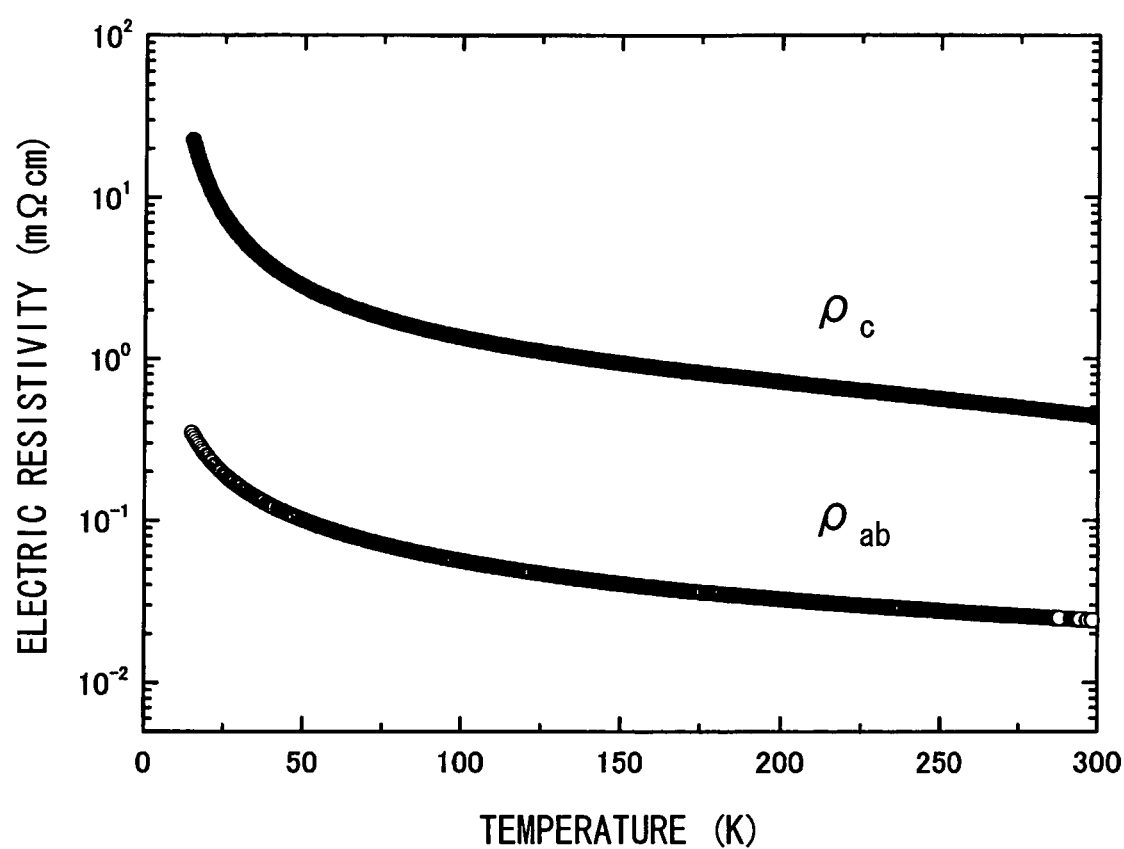
FIG. 21 is a view illustrating the temperature dependence of electric resistivity ρ of the $Ca_3Co_4O_9$ epitaxially grown film of Example 5.

FIG. 21 shows the temperature dependence of the electric resistivities of the $Ca_3Co_4O_9$ thin film measured in the respective directions. Here, the curve $\rho_c$ indicates the electric resistivity along the c-axis direction, that is, the electric resistivity regarding the interlayer direction, and the curve $\rho_{ab}$ indicates the electric resistivity regarding the direction parallel to the layers.

With the element obtained as described above, Au electrodes having a width of 0.5 mm and a thickness of 400 nm were deposited on the thin film by sputtering so that a gap of 9 mm is kept therebetween with respect to the c-axis direction of the $Ca_3Co_4O9$ thin film. In addition, in order to alleviate the effect of immediate loss of the generated temperature difference due to the heat conduction by the substrate, the substrate was thinned by ion beam etching to a thickness of about 1 µm in a portion with a width of about 2 mm that is between the electrodes, and thus, the substrate was provided with a constricted structure.

The resistance value between the two Au electrodes was about 400 Ω at room temperature. When a current of 0.003 mA was steadily passed between the electrodes, a temperature difference of about 1 K was produced between opposite ends. The temperature difference calculated taking into account the electric resistivity and Seebeck coefficient in the c-axis direction, the heat loss effect due to the substrate, and the like, is 0.1 K; therefore, it is appreciated that the experimental value resulted in as great as 10 times that of the theoretical value. The temperature difference actually obtained, converted into a figure of merit of thermoelectric conversion ZT, was about 100 times greater than the measurement value obtained by a steady-state method. It was found that in this case as well, high performance comparable to ZT>1 was achieved in a wide temperature range of 50 K to 800 K.

The present invention makes it possible to provide a thermoelectric conversion device that has high thermoelectric conversion performance to a degree that has not been expected, due to a tunneling current and a thermoelectronic emission phenomenon that are beyond normal electrical conduction effects (thermoelectriceffect). For manufacturing this device, it is possible to apply conventional processes for thin film element fabrication such as represented by photolithography. With this device, a long distance between electrodes can be ensured freely, and therefore high efficiency can be easily attained. Thus, in the field of thermoelectric conversion devices, the present invention is highly useful in industry.

What is claimed is:

1. A thermoelectric conversion device comprising a substrate, a thermoelectric-conversion film arranged on the substrate, and a pair of electrodes; wherein
   the thermoelectric-conversion film is a crystalline thin film obtained through epitaxial growth and formed by arranging an electrically conducting layer and an electrically insulating layer alternately;
   the electrically conducting layer has an octahedral crystal structure in which a transition metal atom M is positioned at the center and oxygen atoms are positioned at the vertexes;
   the electrically insulating layer comprises a metal element or a crystalline metal oxide;
   the c axis of the crystalline thin film formed of the electrically conducting layer and the electrically insulating layer is parallel to an in-plane direction of the substrate; and
   the pair of electrodes are arranged so that electric current flows along the c axis.

2. The thermoelectric conversion device according to claim 1, wherein the transition metal atom M is at least one element selected from Co and Mn.

3. The thermoelectric conversion device according to claim 2, wherein the electrically conducting layer contains Co as the transition metal atom M and has a $CoO_2$ octahedral crystal structure in which edges are shared with one another.

4. The thermoelectric conversion device according to claim 1, wherein the electrically insulating layer comprises a metal element.

5. The thermoelectric conversion device according to claim 4, wherein the metal element is at least one element selected from an alkali metal, an alkaline-earth metal, Hg, Tl, Pb, and Bi.

6. The thermoelectric conversion device according to claim 4, wherein the electrically insulating layer comprises 1 to 3 monolayer(s).

7. The thermoelectric conversion device according to claim 1, wherein the electrically insulating layer comprises a crystalline metal oxide.

8. The thermoelectric conversion device according to claim 7, wherein the electrically insulating layer comprises 1 to 4 monolayer(s).

9. The thermoelectric conversion device according to claim 7, wherein the electrically insulating layer has a rock-salt structure.

10. The thermoelectric conversion device according to claim 7, wherein the electrically insulating layer has a composition represented by the formula $Sr_2(Bi_{2-X4}Pb_{X4})_2O_4$, $Ca_2(Co_{1-X5}Cu_{X5})_2O_4$, $(Ca,Bi)_2CoO_3$, or $Sr_2TiO_3$, where $0 \leq X4 \leq 1$ and $0 \leq X5 \leq 1$.

11. The thermoelectric conversion device according to claim 1, wherein the thermoelectric-conversion film has a composition represented by the formula $A_{X1}MO_{Y1}$, where A is at least one element selected from an alkali metal, an alkaline-earth metal, Hg, Tl, Pb, and Bi, M is at least one element selected from transition metal elements, X1 is a numerical value of 0.1 to 0.8, and Y1 is a numerical value of 1.5 to 2.5.

12. The thermoelectric conversion device according to claim 11, wherein the M is at least one element selected from Co, Ni, Ti, Mn, Fe, and Rh.

13. The thermoelectric conversion device according to claim 12, wherein the M is at least one element selected from Co and Mn.

14. The thermoelectric conversion device according to claim 1, wherein the thermoelectric-conversion film has a composition represented by the formula $Bi_{2-X2}Pb_{X2}Sr_2Co_2O_{Y2}$, where X2 is a numerical value of 0 to 0.5, and Y2 is a numerical value of 7.5 to 8.5.

15. The thermoelectric conversion device according to claim 1, wherein the thermoelectric-conversion film has a composition represented by the formula $(Ca_{1-X3-Y3}Sr_{X3}Bi_{Y3})_3Co_4O_9$, where X3 is a numerical value of 0 to less than 1 and Y3 is a numerical value of 0 to 0.3.

16. The thermoelectric conversion device according to claim 1, wherein:

the electrically conducting layer contains at least one element selected from Co and Mn, and has a perovskite structure or a $CdI_2$ structure; and the electrically insulating layer contains at least one element selected from an alkali metal, an alkaline-earth metal, Hg, Tl, Pb, and Bi, and has a rock-salt structure.

17. The thermoelectric conversion device according to claim 1, wherein the pair of electrodes is arranged so as to be spaced apart by 1 mm or greater with respect to the c-axis direction.

18. The thermoelectric conversion device according to claim 1, wherein the thickness of the substrate is reduced in a portion of a region sandwiched between the pair of electrodes.

19. The thermoelectric conversion device according to claim 1, further comprising a buffer layer arranged between the substrate and the thermoelectric-conversion film.

20. The thermoelectric conversion device according to claim 19, wherein the buffer layer contains at least one selected from $CeO_2$, $ZrO_2$, $TiO_2$, ZnO, NiO, $Fe_2O_3$, $Cr_2O_3$, $Al_2O_3$, $Cr_2O_3$, Cr, and Pt.

21. The thermoelectric conversion device according to claim 1, wherein a material for the substrate is resin.

22. A cooling method, using a thermoelectric conversion device comprising a substrate, a thermoelectric-conversion film arranged on the substrate, and a pair of electrodes, the method comprising:

passing electric current between the pair of electrodes to cause a temperature difference between the pair of electrodes, whereby one of the pair of electrodes is made a low temperature part; wherein the thermoelectric-conversion film is a crystalline thin film obtained through epitaxial growth, and formed by arranging an electrically conducting layer and an electrically insulating layer alternately;

the electrically conducting layer has an octahedral crystal structure in which a transition metal atom M is positioned at its center and oxygen atoms are positioned at vertexes;

the electrically insulating layer comprises a metal element or a crystalline metal oxide;

the c axis of the crystalline thin film composed of the electrically conducting layer and the electrically insulating layer is parallel to an in-plane direction of the substrate; and the pair of electrodes are arranged so that electric current flows along the c axis.

23. The cooling method according to claim 22, wherein a pulse current is passed through between the pair of electrodes.

24. An electric power generating method, using a thermoelectric conversion device comprising a substrate, a thermoelectric-conversion film arranged on the substrate, and a pair of electrodes, the method comprising:

supplying heat between the pair of electrodes so as to cause a temperature difference therebetween, whereby a potential difference is caused between the pair of electrodes; wherein the thermoelectric-conversion film is a crystalline thin film obtained through epitaxial growth, and formed by arranging an electrically conducting layer and an electrically insulating layer alternately;

the electrically conducting layer has an octahedral crystal structure in which a transition metal atom M is positioned at its center and oxygen atoms are positioned at vertexes;

the electrically insulating layer comprises a metal element or a crystalline metal oxide;

the c axis of the crystalline thin film composed of the electrically conducting layer and the electrically insulating layer is parallel to an in-plane direction of the substrate; and the pair of electrodes are arranged so that electric current flows along the c axis.

* * * * *